United States Patent
Miyazawa et al.

(10) Patent No.: US 7,196,457 B2
(45) Date of Patent: Mar. 27, 2007

(54) PIEZOELECTRIC FILM, PIEZOELECTRIC ELEMENT, PIEZOELECTRIC ACTUATOR, PIEZOELECTRIC PUMP, INK-JET TYPE RECORDING HEAD, INK-JET PRINTER, SURFACE-ACOUSTIC-WAVE ELEMENT, THIN-FILM PIEZOELECTRIC RESONATOR, FREQUENCY FILTER, OSCILLATOR, ELECTRONIC CIRCUIT, AND ELECTRONIC APPARATUS

(75) Inventors: Hiromu Miyazawa, Toyoshina-machi (JP); Takeshi Kijima, Matsumoto (JP); Eiji Natori, Chino (JP); Taku Aoyama, Setagaya-ken (JP); Setsuya Iwashita, Nirasaki (JP); Takamitsu Higuchi, Matsumoto (JP)

(73) Assignee: Seiko Epson Corporation (JP)

( * ) Notice: Subject to any disclaimer, the term of this patent is extended or adjusted under 35 U.S.C. 154(b) by 237 days.

(21) Appl. No.: 10/970,697

(22) Filed: Oct. 21, 2004

(65) Prior Publication Data

US 2005/0146249 A1    Jul. 7, 2005

(30) Foreign Application Priority Data

Oct. 23, 2003  (JP) ............................. 2003-363196
Sep. 24, 2004  (JP) ............................. 2004-277859

(51) Int. Cl.
*H01L 41/187* (2006.01)
*B41J 2/045* (2006.01)

(52) U.S. Cl. .................. 310/358; 252/62.9 PZ; 252/62.9 R; 501/134

(58) Field of Classification Search ............... 310/358
See application file for complete search history.

(56) References Cited

U.S. PATENT DOCUMENTS

| | | | |
|---|---|---|---|
| 5,648,012 A | * | 7/1997 | Higashibeppu et al. .............. 252/62.9 PZ |
| 6,117,355 A | * | 9/2000 | Yoshizawa et al. .... 252/62.9 R |
| 6,440,324 B1 | * | 8/2002 | Hayashi et al. ....... 252/62.9 PZ |
| 6,599,757 B1 | * | 7/2003 | Murai ........................ 438/3 |
| 2002/0027215 A1 | * | 3/2002 | Shindo et al. ........ 252/62.9 PZ |
| 2003/0132991 A1 | * | 7/2003 | Higuchi et al. ............... 347/70 |
| 2004/0053460 A1 | * | 3/2004 | Higuchi et al. ............. 438/200 |

FOREIGN PATENT DOCUMENTS

JP       2001-223404       8/2001

* cited by examiner

*Primary Examiner*—Darren Schuberg
*Assistant Examiner*—J. Aguirrechea
(74) *Attorney, Agent, or Firm*—Harness, Dickey & Pierce, P.L.C.

(57) ABSTRACT

A piezoelectric film is provided having good piezoelectric properties. The piezoelectric film is represented by the following general formula: $A_{1-b}B_{1-a}X_aO_3$ wherein A contains Pb; B is at least one of Zr and Ti; X is at least one of V, Nb, Ta, Cr, Mo and W; a satisfies $0.05 \leq a \leq 0.3$; and b satisfies $0.025 \leq b \leq 0.15$.

18 Claims, 12 Drawing Sheets

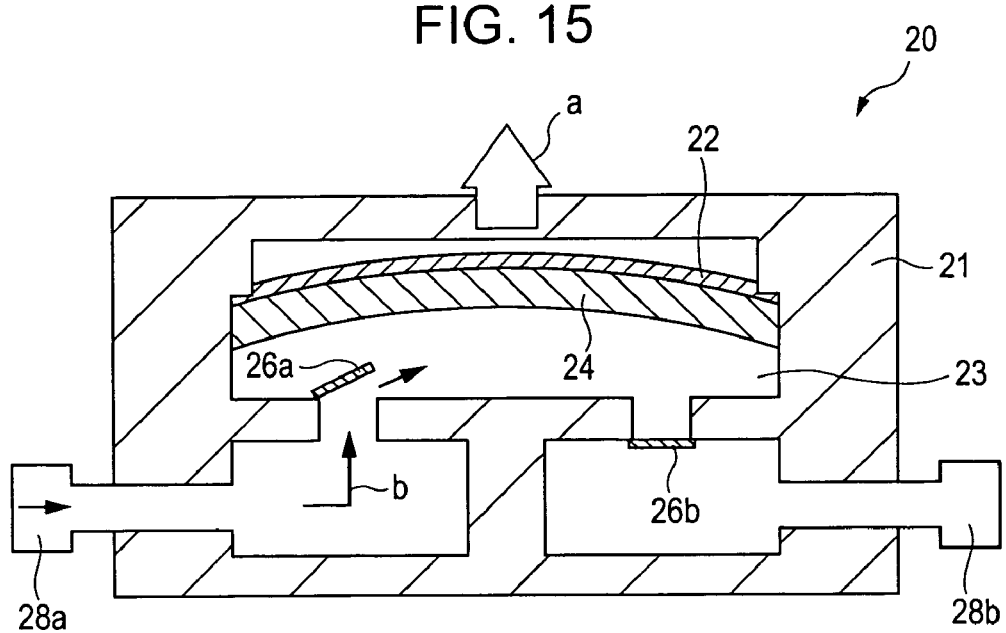
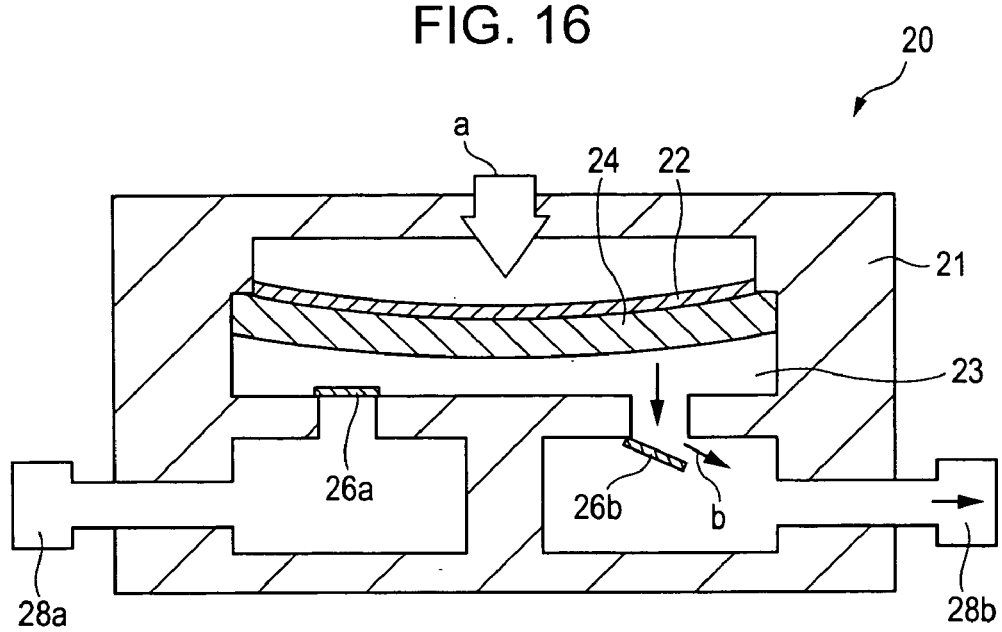

PIEZOELECTRIC FILM, PIEZOELECTRIC ELEMENT, PIEZOELECTRIC ACTUATOR, PIEZOELECTRIC PUMP, INK-JET TYPE RECORDING HEAD, INK-JET PRINTER, SURFACE-ACOUSTIC-WAVE ELEMENT, THIN-FILM PIEZOELECTRIC RESONATOR, FREQUENCY FILTER, OSCILLATOR, ELECTRONIC CIRCUIT, AND ELECTRONIC APPARATUS

RELATED APPLICATIONS

This application claims priority to Japanese Patent Application Nos. 2003-363196 filed Oct. 23, 2003 and 2004-277859 filed Sep. 24, 2004 which are hereby expressly incorporated by reference herein in their entirety.

BACKGROUND

1. Technical Field

The present invention relates to a piezoelectric film, a piezoelectric element, a piezoelectric actuator, a piezoelectric pump, an ink-jet type recording head, an ink-jet printer, a surface-acoustic-wave. element, a thin-film piezoelectric resonator, a frequency filter, an oscillator, an electronic circuit and an electronic apparatus.

2. Related Art

As a printer which allows high-quality and high-speed printing, an ink-jet printer has been widely known. An ink-jet printer has an ink-jet type recording head having cavities whose internal volume varies and performs printing by discharging ink drops from nozzles while the head moves to scan. Conventionally, as a head actuator in an ink-jet type recording head for such an ink-jet printer, a piezoelectric element using a piezoelectric film which is represented by PZT (Pb(Zr, Ti)O$_3$) is used (for example, see Japanese Unexamined Patent Application Publication No. 2001-223404).

Further, since performance enhancement has been required in a surface-acoustic-wave element, a frequency filter, an oscillator, an electronic circuit and the like, there is a need to provide a novel piezoelectric material by which high-quality goods can be manufactured.

An object of the present invention, therefore, is to provide a piezoelectric film having good piezoelectric properties. Another object of the present invention is to provide a piezoelectric element using the piezoelectric film and to provide, using the piezoelectric element, a piezoelectric actuator, a piezoelectric pump, an ink-jet type recording head, an ink-jet printer, a surface-acoustic-wave element, a thin-film piezoelectric resonator, a frequency filter, an oscillator, an electronic circuit and an electronic apparatus.

SUMMARY

A piezoelectric film of the present invention is represented by the following general formula:

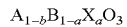

$$A_{1-b}B_{1-a}X_aO_3$$

wherein A contains Pb; B is at least one of Zr and Ti; X is at least one of V, Nb, Ta, Cr, Mo and W; a satisfies $0.05 \leq a \leq 0.3$; and b satisfies $0.025 \leq b \leq 0.15$.

According to this piezoelectric film, when X, whose valence is higher than that of B, is substituted with B, which is located on the B site of a perovskite structure, the crystal structure is neutral as a whole, thereby enhancing its insulating properties.

In the piezoelectric film according to the present invention, when A is Pb, and B consists of Zr and Ti, the above-mentioned general formula, $A_{1-b}B_{1-a}X_aO_3$, becomes $Pb_{1-b}(Zr, Ti)_{1-a}X_aO_3$. Hereinafter, each of A and B is same as described above.

In the present invention, the range of the composition ratio of each element shown in the above general formula is not strictly limited thereto, and can have a deviation to the extent that desired properties can be acquired, or a deviation due to a measurement error. This is also true of general formulas, which will be described below.

According to this piezoelectric film, when X, whose valence is higher than that of B, is substituted with B, which is located on the B site of a perovskite structure, the crystal structure is neutral as a whole, thereby enhancing insulating properties.

According to the piezoelectric film of the present invention, Pb is preferably partially substituted with at least an element whose valence is higher than that of Pb.

In the piezoelectric film according to the present invention, preferably, the element whose valence is higher than that of Pb is preferably an element belonging to a lanthanoid group.

In the piezoelectric film according to the present invention, the piezoelectric film preferably has a rhombo-hedral structure, has a preferred (100) orientation in a pseudo-cubic crystal system.

According to the present invention, the term "preferred orientation" includes the case when 100% of the crystals have a (001) orientation, and the case when most of crystals (for example, 90% of crystals) have a desired (001) orientation and the remaining crystals have other orientations (for example, a (111) orientation).

In the piezoelectric film according to the present invention, X is preferably at least one of V, Nb and Ta, and the deficient amount b of A is almost half of the additive amount a of X.

In the piezoelectric film according to the present invention, X is preferably at least one of Cr, Mo and W, and the deficient amount b of A is almost the same as the additive amount a of X.

In the piezoelectric film according to the present invention, preferably, X includes X1 and X2, the composition ratio of X1 and X2 is represented by (a−e):e, X1 is at least one of V, Nb and Ta, X2 is at least one of Cr, Mo and W, and the deficient amount b of A is almost the same as the total amount of (a−e)/2, which is a half of the additive amount of X1 and the additive amount e of X2.

In the piezoelectric film according to the present invention, X is preferably present at B sites of a perovskite structure.

In the piezoelectric film according to the present invention, B preferably includes Zr and Ti, and the composition ratio of Zr:Ti is represented by (1−p):p, and p is $0.2 \leq p \leq 0.6$.

A piezoelectric element according to the present invention may include the above-mentioned piezoelectric film.

A piezoelectric element according to the present invention may include a lower electrode formed on a substrate, wherein the piezoelectric film is formed on the lower electrode; and an upper electrode formed on the piezoelectric film, wherein at least one of the lower electrode and the upper electrode is made of a material whose main component is Pt.

In the present invention, that one thing (hereinafter, referred to as "A") formed on another thing (hereinafter, referred to as "B") should be construed to include the "A" which is directly formed right on the "B" and the "A"

formed on the "B" with a third thing interposed between them. Further, in the present invention, that "A" is formed on "B" should be construed to include both a case in which the "A" is directly formed right on the "B" and a case in which the "A" is formed on the "B" with a third thing interposed between them.

In the piezoelectric element according to the present invention, the element may include a buffer layer formed on the substrate by an ion-beam assisted method; a lower electrode of a perovskite structure. formed on the buffer layer, wherein the piezoelectric film is formed on the lower electrode; and an upper electrode formed on the piezoelectric film.

In the piezoelectric element according to the present invention, the lower electrode preferably has a (100) orientation in a pseudo-cubic crystal system grown epitaxially.

A piezoelectric actuator according to the present invention may employ the above-mentioned piezoelectric element.

A piezoelectric pump according to the present invention may employ the above-mentioned piezoelectric element.

An ink-jet type recording head according to the present invention may employ the above-mentioned piezoelectric element.

An ink-jet printer according to the present invention may employ the above-mentioned ink-jet type recording head.

A surface-acoustic-wave element according to the present invention may employ the above-mentioned piezoelectric element.

A thin-film piezoelectric resonator according to the present invention may employ the above-mentioned piezoelectric element.

A frequency filter according to the present invention may employ at least one of the above-mentioned surface-acoustic-wave element and the above-mentioned thin-film piezoelectric resonator.

An oscillator according to the present invention may employ at least one of the above-mentioned surface-acoustic-wave element and the above-mentioned thin-film piezoelectric resonator.

An electronic circuit according to the present invention may employ at least one of the above-mentioned frequency filter and the above-mentioned oscillator.

An electronic apparatus according to the present invention can employ at least one of the above-mentioned piezoelectric pump and the above-mentioned electronic circuit.

BRIEF DESCRIPTION OF THE DRAWINGS

FIG. 15 is a schematic sectional view of a piezoelectric pump according to a fourth embodiment of the present invention;

FIG. 16 is a schematic constructional view of the piezoelectric pump according to the fourth embodiment of the present invention;

DETAILED DESCRIPTION

Hereinafter, preferred embodiments of the present invention will be described with reference to the accompanying drawings.

1. First Embodiment 1-1. Piezoelectric Film and Piezoelectric Element

Figure 1:
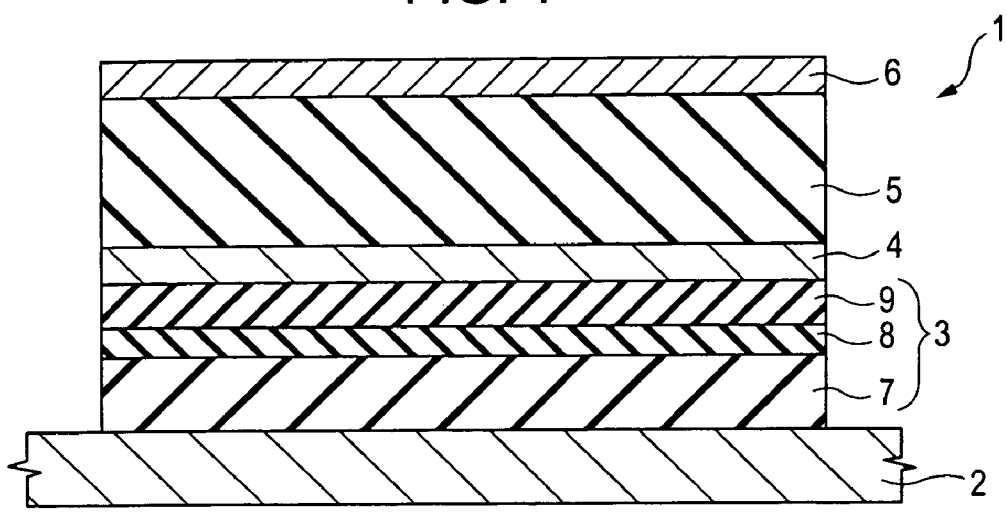
FIG. 1 is a sectional view of a piezoelectric element according to a first embodiment of the present invention.

FIG. 1 shows a first embodiment of the present invention, especially when a piezoelectric element 1 of this invention is applied to a piezoelectric element 1 which serves as a head actuator for an ink-jet type recording head.

This piezoelectric element 1 includes a buffer layer 3 formed on a substrate 2, a lower electrode 4 formed on the buffer layer 3, a piezoelectric film 5 formed on the lower electrode 4, and an upper electrode 6 formed on the piezoelectric film 5.

For a substrate 2, a silicone substrate can be employed. In this embodiment, a substrate using a plane (110) of silicon crystal is used as the surface of the substrate 2. By being machined, a substrate 2 is formed with ink cavities in the ink-jet type recording head 50 as will be described. Further, the buffer layer 3 functions as an elastic film in the ink-jet type recording head 50.

For a buffer layer 3, although a buffer layer with a single-way orientation (whose orientations are arranged only in the thickness direction) is preferable, an in-plane buffer layer (whose orientations are arranged over all the three dimensions) is more preferable. By forming such a buffer layer 3, a good bonding property (adhesion property) can be obtained between the substrate 2 on which a natural oxidization layer is formed, and a lower electrode 4 which will be mentioned later. Moreover, due to the crystallinity and orienting characteristics of the lower electrode 3, it is possible to control crystallinity and orienting characteristics of the lower electrode 4 and piezoelectric film 5 formed thereon. Consequently, a piezoelectric element 1 having excellent device characteristics can be obtained.

It is preferable that the buffer layer 3 includes at least one of a metallic oxide of an NaCl structure, a metallic oxide of a fluorite structure, a metallic oxide of a perovskite structure, and the like. Particularly, it is preferable that the buffer layer 3 have a laminated structure of a metallic oxide of an NaCl structure or a metallic oxide of a fluorite structure, and a metallic oxide of a perovskite structure. This is because lattice mismatch between a metallic oxide of an NaCl structure or a metallic oxide of a fluorite structure and a metallic oxide having a perovskite structure is small. Thus, when a lower electrode of a perovskite structure is formed as the lower electrode 4, as will be described below, it is advantageous to employ a perovskite structure as a layer thereunder.

According to this embodiment, the buffer layer 3 is comprised of a first buffer layer 7 and a second buffer layer 8, each of which is made of a metallic oxide of an NaCl structure or a metallic oxide of a fluorite structure, and a third buffer layer 9, formed on the second buffer layer 8, which is made of a metallic oxide having a perovskite structure.

The first buffer layer 7 can be formed by, for example, an ion-beam assisted method. For example, a yttria stabilized zirconia (hereinafter, referred to as "YSZ") having a (100) orientation in a cubic crystal system can be used for the first buffer layer 7. As the YSZ, what is represented by the following formulas can optionally be used:

$Zr_{1-x}Ln_xO_y$ $0 \leq x \leq 1.0$

Tm, Yb, Lu).

The thickness of the first buffer layer 7 can be made to be large as, for example, about 1μm. The reason why the first buffer layer 7 is formed thickly is to make the buffer layer 7 function as an etching stopper layer when ink cavities are formed in the substrate 2 by etching, as will be described below. Further, since the first buffer layer 7 is formed thickly, it is possible to make the first buffer layer 7 substantially function as an elastic film when making the buffer layer 3 function as an elastic film in an ink-jet type recording head 50.

The first buffer layer 7 is directly formed on the substrate 2. However, a natural oxide (silicon dioxide) film may be formed on the substrate 2 comprised of a silicon substrate. Since it is difficult to epitaxially grow YSZ on the natural oxide film using a general growth method, in this embodiment of the, present invention, an ion-beam assisted method, as will be described below, is employed to obtain an epitaxially grown first buffer layer 7. In addition, the natural oxide film formed on the substrate 2 may be an amorphous film.

For the second buffer layer 8, for example, $CeO_2$ having a (100) orientation in a cubic crystal system can be used. What is epitaxially grown on the first buffer layer 7 can be used as the second buffer layer 8. The thickness of the second buffer layer 8 is, for example, about 100 nm.

In addition, the material for the first buffer layer 7 and the second buffer layer 8 is not limited to YSZ or $CeO_2$, and a metallic oxide of an NaCl structure or a metallic oxide of a fluorite structure can be used. As the metallic oxide of an NaCl structure, MgO, CaO, SrO, BaO, MnO, FeO, CoO, NiO, or a solid solution containing them can be used. Among them, it is preferable to use at least one of, particularly, MgO, CaO, SrO, BaO and a solid solution containing them. Such a metallic oxide of an NaCl structure has an especially small lattice mismatch with a metallic oxide having a perovskite structure.

As the metallic oxide of a fluorite structure, YSZ, $CeO_2$, $ZrO_2$, $ThO_2$, $UO_2$, or a solid solution containing them can be used. Among them, it is preferable to use at least one of, particularly, YSZ, $CeO_2$, $ZrO_2$, and a solid solution containing them. Such a metallic oxide of a fluorite structure also has an especially small lattice mismatch with a metallic oxide having a perovskite structure.

As the third buffer layer 9, $YBa_2Cu_3O_x$ (x is, for example, 7) which is a stratified perovskite oxide, for example, can be used. What is epitaxially grown on the second buffer layer 8 with (001) orientation in an orthorhombic crystal system can be used for the third buffer layer 9. The thickness of the third buffer layer 9 is, for example, about 30 nm. By using for the third buffer layer 9 a metallic oxide having a perovskite structure, lattice mismatch between the third buffer layer 9 and such a second buffer layer 8, as previously described, becomes especially small. Therefore, it is possible to obtain a good crystal structure having no defects and to make a perovskite-type lower electrode 4 epitaxially grown on the third buffer layer 9.

In addition, the material for the third buffer layer 9 is not limited to $YBa_2Cu_3O_x$, and other perovskite-type metallic oxides can be used. For example, $CaRuO_3$, $SrRuO_3$, $BaRuO_3$, $SrVO_3$, $(La, Sr)MnO_3$, $(La, Sr)CrO_3$, $(La, Sr)CoO_3$, or a solid solution containing them can also be used.

For the lower electrode 4, for example, $SrRuO_3$ which is epitaxially grown with, preferably, a (100) orientation in a pseudo-cubic crystal system can be used. As the lower electrode 4, by using what is epitaxially grown with, preferably, a (100) orientation in a pseudo-cubic crystal system, it is possible to more easily form, on the lower electrode 4, a piezoelectric film 5 which has, preferably a (100) orientation in a pseudo-cubic crystal system, and has a rhombohedral structure. The thickness of the lower electrode 4 is, for example, about 50 to 150 nm.

As the lower electrode 4, for example, Pt having a (100) orientation can be used. In this case, the thickness of the lower electrode 4 is, for example, about 30 nm. As the lower electrode 4, for example, Pt having a (111) orientation can also be used. In this case, by setting the thickness of the piezoelectric film 5, which will be described below, to 100 nm or more, the piezoelectric film 5 comes to have, preferably a (100) orientation in a pseudo-cubic crystal system, thereby obtaining the piezoelectric film 5 having the preferred (100) orientation in a pseudo-cubic crystal system.

The piezoelectric film 5 has a perovskite crystal structure, and can be represented by the following general formula.

$$A_{1-b}B_{1-a}X_aO_3$$

Figure 2:
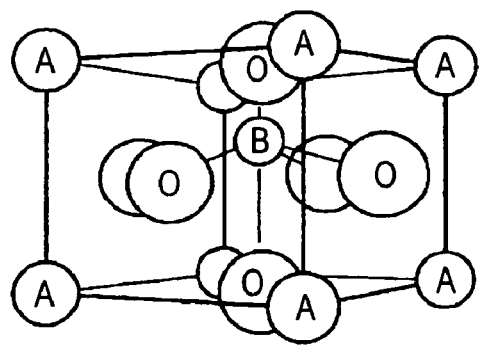
FIG. 2 is an explanatory view of a perovskite crystal structure.
Figure 3:
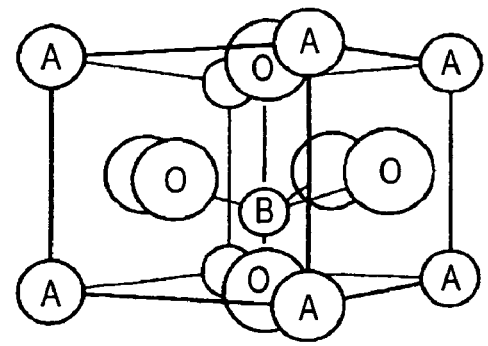
FIG. 3 is an explanatory view of a perovskite crystal structure.

A contains Pb. B is at least one of Zr and Ti. X is at least one of V, Nb, Ta, Cr, Mo and W. For example, the piezoelectric film 5 can be made of $Pb_{1-b}(Zr, Ti)_{1-a}X_aO_3$ (hereinafter, referred to as "PZTX") which has a perovskite crystal structure. PZTX is a formula where X is added to $Pb(Zr_{1-p}Ti_p)O_3$ (hereinafter, referred to as "PZT") having a perovskite crystal structure. The additive amount of X is represented by "a" in the above formula. The perovskite-type has a crystal structure as shown in FIGS. 2 and 3, and the sites represented by "A" and "B" in FIGS. 2 and 3 are respectively referred to "A" site and "B" site. In PZTX, Pb is located on the "A" site and Zr, Ti, and X are located on the "B" site. Further, O (oxygen) is located on the site represented by "O" in FIGS. 2 and 3.

In the composition formula of PZT, "p" in $Pb(Zr_{1-p}Ti_p)O_3$ which functions as a ground material, has a certain range. The upper limit of p is the value of p (hereinafter, referred to as "$p_{MPB}$") at the morphotropic phase boundary (MPB) of the crystal structure of the piezoelectric film 5. The value of p at the phase boundary, "$p_{MPB}$", represents the value of the composition ratio of Ti at the point when phase transition occurs between a rhombo-hedral structure and a tetragonal structure. And, p is within the range of being smaller than the composition ratio at the point of a phase transition, thereby becoming a rhombo-hedral structure. Here, a piezoelectric constant ($d_{31}$) takes the maximum value in the vicinity of the phase boundary. Accordingly, a value near the value of p at the phase boundary "$p_{MPB}$" is chosen as the lower limit of p. Therefore, as a range of p suitable for carrying out this invention, a comparatively small value is allowable, but in order to get a higher piezoelectric constant ($d_{31}$), it is preferable to select a value which is nearer to the p value at the phase boundary ("$p_{MPB}$"). Accordingly, the lower limit of p is the value of p at the time of the piezoelectric constant ($d_{31}$) becoming the allowable lower limit when the piezoelectric element 1 operates. According to what is described above, p can be represented by the following general formula.

$$(p_{MPB}-0.05) \leq p \leq p_{MPB}$$

When X is not added to PZT (i.e., in the case of PZT), $p_{MPB}$ is about 0.50. On the other hand, when X is added to the "B" site of PZT by 20 atomic percent, $p_{MPB}$ is, for example, about 0.45 to 0.6. In addition, since $p_{MPB}$ may be varied depending on the additive amount of X, film-forming conditions, film stress and the like, it is not particularly limited, and it can be present in the following range.

$$0.25 \leq p_{MPB} \leq 0.6$$

Therefore, p can be present in the following range.

$$0.2 \leq p \leq 0.6$$

When p is within the range described above, it is possible to easily control the piezoelectric film 5 made of PZTX in the rhombo-hedral structure in the vicinity of the phase boundary, and a device having excellent piezoelectric properties can be obtained. The piezoelectric film 5 can also have a p value at the phase boundary ($p_{MPB}$) of the crystal structure of the piezoelectric film 5. As a result, the piezoelectric constant ($d_{31}$) can be maximized.

As X, a metallic element whose valence is higher than Zr or Ti can be employed. As a metallic element whose valence is higher than that of Zr or Ti (+4), there are, for example, V (+5), Nb (+5), Ta (+5), Cr (+6), Mo (+6), W (+6) and the like. That is, X can be at least one selected from V, Nb, Ta, Cr, Mo, and W.

In the material having a perovskite crystal structure of Pb system, for example, for example, PZT and the like, Pb located on the "A" site of the perovskite structure tends to be easily vaporized because the vapor pressure of Pb is high. In the composition formula of PZTX, $Pb_{1-b}(Zr, Ti)_{1-a}X_aO_3$ as described above, b represents a deficient amount of Pb. If Pb is extracted from the "A" site, oxygen will suffer a loss simultaneously according to the principle of electric charge neutrality. This phenomenon is referred to as Schottoky defect. For example, if oxygen suffers a loss in PZT, the band gap of PZT will fall down. By the falling down of this band gap, the band offset at the electrode interface decreases and the insulation property of the piezoelectric film made of PZT deteriorates.

Further, it can be shown from a molecular dynamics simulation that an oxygen defect causes diffusion of an oxygen ion through the network of the defect. An oxygen ion is the easiest ion to diffuse among atoms in a PZT system. When there is an oxygen defect, it can be understood that the oxygen ion moves along an octahedron in the perovskite crystal structure. The movement of this oxygen ion causes accumulation of the defect in the vicinity of the electrode interface, which is expected to cause deterioration of repeated durability.

However, according to the present invention, by replacing the element of the "B" site (Zr, Ti) with X whose valence is higher than the valence of Zr or Ti (+4), it is possible to keep the crystal structure neutral as a whole without suffering oxygen loss even though Pb loss occurs. As a result, the insulation property of the piezoelectric film 5 will be improved and current leaks can be prevented.

For example, when X is Nb, since the size of Nb is almost the same as that of Ti (the ion radius is nearly the same) and the weight of Nb is twice as much as that of Ti, it is difficult for an atom to escape from a lattice even by the collision between atoms due to lattice vibration. Moreover, Nb forms a significantly strong covalent bond with oxygen and it is expected to enhance the ferroelectric properties shown by Curie temperature, polarization moment, and the like, and the piezoelectric properties shown by a piezoelectric constant and the like (H. Miyazawa, E. Natori, S. Miyashita; Jpn. J. Appl. Phys. 39 (2000) 5679). In addition, although the case when X is Nb is exemplified above, even when X is at least one of V, Ta, Cr, Mo, and W, an equivalent effect thereto is expected.

When X is an element having a valence of +5, it is preferable that "a", an additive amount of X, is present in the following range.

$$0.05 \leq a \leq 0.30$$

In this case, "b", a deficient amount of Pb, is preferable to be a half of "a", an additive amount of X. That is, from the viewpoint of an ion model, in order for the piezoelectric film 5 to exhibit a good insulation property, it is preferable that "b", a deficient amount of Pb is represented by b≅a/2 and present in a range of $0.025 \leq b \leq 0.15$. In addition, actually, the range of "a" and "b" is related to a measurement error etc. This is true of all the numerical limitations which will be given below.

The numerical limitation mentioned above has the following meaning. When "a", an additive amount of X, is less than 0.10, the current leak preventing effect due to addition is not so good, whereas when "a" is over 0.30, the crystallinity of the piezoelectric film 5 suffers deterioration, thereby deteriorating the piezoelectric properties. As X, whose valence is +5, for example, there are V, Nb, Ta and the like. Among them, Nb and Ta are preferable, and Nb is more preferable because it forms a strong covalent bond with oxygen and its ion radius is similar to that of Ti.

When X is an element whose valence is +6, "a", an additive amount of X is preferable to be $0.05 \leq a \leq 0.15$. In this case, "b", a deficient amount of Pb, is preferable to be almost the same as "a", an additive amount of X. That is, from the viewpoint of an ion model, in order for the piezoelectric film 5 to show good insulation property, it is preferable that "b", a deficient amount of Pb, is represented by b≅a and is in a range of $0.05 \leq b \leq 0.15$.

When "a", an additive amount of X, is less than 0.05, the current leak preventing effect due to addition is not so good, whereas when "a" is over 0.15, the crystallinity of the piezoelectric film 5 suffers deterioration, thereby deteriorating the piezoelectric properties. As the case of X being an element whose valence is +6, Cr, Mo, W and the like can be exemplified.

When X includes elements of X1 (+5) and X2 (+6), the general formula of the piezoelectric film 5 is represented by $A_{1-b}B_{1-a}X1_{a-e}X2_eO_3$. "(a-e)" is an additive amount of X1 and "e" is an additive amount of X2. In this case, it is preferable that "(a-e)" of an additive amount of X1 and "e" of an additive amount of X2 is in a range of $0.05 \leq (a-e)/2 + e \leq 0.15$. And, it is preferable that "b" of a deficient amount of Pb is almost the same as the sum of the half of the additive amount of X1, (a-e)/2, and an additive amount of X2, "e". That is, from the viewpoint of an ion model, in order for the piezoelectric film 5 to show good insulation property, it is preferable that "b" of the deficient amount of Pb is represented by b≅(a-e)/2+e and is in a range of $0.05 \leq b \leq 0.15$.

When (a-e)/2+e, the total amount (hereinafter, referred to as "f") of (a-e)/2, a half of the additive amount of X1, and "e" of the additive amount of X2, is less than 0.05, the current leak preventing effect due to addition is not so good, whereas when "f" is over 0.15, the crystallinity of the piezoelectric film 5 suffers deterioration, thereby deteriorating the piezoelectric properties. A prefeable element as X1 is Nb and a preferable element as X2 is Mo or W.

The piezoelectric film 5 has a rhombo-hedral structure and, preferably, a (100) orientation in a pseudo-cubic crystal system. This piezoelectric film 5 which has a rhombo-hedral structure and has preferred (100) orientation in a pseudo-cubic crystal system can be obtained by adjusting film forming conditions such as temperature.

Further, the piezoelectric film 5 having the preferred (100) orientation in a pseudo-cubic crystal system can be obtained by using the buffer layer 3 as described above. In addition, it is possible to control the value of $P_{MPB}$, as described above, by controlling the amount of Ti which is contained in the piezoelectric film 5, by controlling the content of ions radiated when an ion-beam assisted method is employed for forming the buffer layer 3 or by combination thereof. As a result, a piezoelectric film 5 having a rhombo-hedral structure can be obtained. In addition, the reason why a $p_{MPB}$ value can be controlled by controlling the content of ions is described below.

First, it is possible to control the content of ions which are taken into the film by controlling the content of ions radiated. Thereby, the buffer layer 3 itself and the lattice constant of the lower electrode 4 thereon can be controlled to be, for example, about ±1%. Therefore, it is possible to control an epitaxial stress which is applied to the piezoelectric film 5 formed on lower electrode 4. Since it is possible to control the epitaxial stress, it is also possible to easily control the $P_{MPB}$ value of the piezoelectric film 5. Consequently, in a predetermined composition domain, the piezoelectric film 5 having a rhombo-hedral structure can be obtained.

The thickness of the piezoelectric film 5 is, for example, about 500 to 1500 nm. In order to specify the structure of the piezoelectric film 5, X-ray diffraction and Raman scattering can be employed together. According to this embodiment, at least one of an ICP method, an XPS method and a SIMS method can be used for the determination of composition.

In addition, the above-mentioned piezoelectric film 5 is represented by the general formula $A_{1-b}B_{1-a}X_aO_3$, and O (oxygen) is not subject to loss. However, it is also possible to extract oxygen. In that case, the general formula becomes $A_{1-b-c}B_{1-a}X_aO_{3-c}$. In this case, it is preferable that the deficient amount of oxygen "c" is in a range of $0 < c \leq 0.03$. From the viewpoint for enhancing piezoelectric properties, it is preferable that the amount of "c" of the deficient amount of oxygen is near zero as much as possible.

Further, Pb located on the A site in the perovskite structure of the piezoelectric film 5 can also be replaced in part with Z whose valence is higher than that of Pb (+2). That is, in this case, the general formula of the piezoelectric film 5 is $(A_{1-d}Z_d)_{1-b-c}B_{1-a}X_aO_{3-c}$. In this case, it is preferable that "c" which is a deficient amount of oxygen is in a range of $0 \leq c \leq 0.03$. Further, it is preferable that "d" which is an additive amount of Z is in a range of $0 < d \leq 0.05$. For Z, for example, lantanoids are preferable such as La, Ce, Pr, Nd, Pm, Sm, Eu, Gd, Tb, Dy, Ho, Er, Tm, Yb, and Lu, etc., and more preferably,. La, Ce, Pr, Nd, and Sm, each of which has an valence of +3 and whose ion radius is similar to that of Pb. In this way, the valence of Pb loss can be supplemented by substituting Pb in part with an element whose valence is higher than that of Pb.

As the upper electrode 6, the same kind of one as the lower electrode 4, for example, $SrRuO_3$ epitaxilly grown with preferred (100) orientation in a pseudo-cubic crystal system can be employed. Alternatively, Pt can also be used for the upper electrode 6. The thickness of the upper electrode 6 is, for example, about 50 to 150 nm.

1-2. Method for Manufacturing Piezoelectric Film and Piezoelectric Element

Next, a method for manufacturing a piezoelectric film and a piezoelectric element will be described.

(1) First, a substrate 2 made of silicon whose surface is plane with (110) orientation is prepared. As cavities (ink cavities) should be formed on the silicon substrate as will be described below, the silicon substrate used for the substrate 2 should have a predetermined thickness necessary therefore.

Subsequently, the substrate 2 is loaded into a substrate holder and placed in a vacuum apparatus (not shown). In the vacuum apparatus, various targets are arranged to face the substrate 2 with a predetermined distance from each other, such as targets for the buffer layers each of which includes constituent elements of the buffer layers 7, 8 and 9 respectively, and targets for the lower electrode 4 and the upper electrode 6 each of which includes constituent elements thereof respectively. As the respective targets, what have the same or similar composition as that of the first buffer layer 7, second buffer layer 8 and third buffer layer 9, the lower electrode 4 and the upper electrode 6 can be properly used.

That is, as a target for the first buffer layer 7, a composition that has the same composition as the desired YSZ, or a composition approximate thereto can be used. As a target for the second buffer layer 8, a composition that has the same composition as the desired $CeO_2$, or the composition approximate thereto can be used. As a target for the third buffer layer 9, a composition that has the same composition as the desired $YBa_2Cu_3O_x$, or the composition approximate thereto can be used. As targets for the lower electrode 4 and the upper electrode 6, a composition that has the same composition as the desired $SrRuO_3$ or the composition approximate thereto and what has Pt as a main component can be used, respectively.

Figure 4:
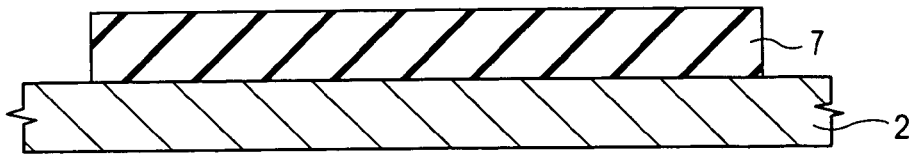
FIG. 4 is a sectional view schematically illustrating a manufacturing process of the piezoelectric element according to the first embodiment the present invention.

(2) Next, as shown in FIG. 4, the first buffer layer 7 is formed directly on the substrate 2 using the ion-beam assisted method mentioned above. The details thereof are as follows.

According to a laser ablation method, when laser light is radiated onto the target for the first buffer layer 7, atoms containing an oxygen atom and a metal atom is driven out of this target, thereby generating a plume. This plume is emitted toward the substrate 2 and comes to contact the substrate 2. At almost the same time, an ion-beam assisted method is carried out by radiating ion beams at a predetermined angle (incidence), which will be mentioned below, onto the surface of the substrate 2. Consequently, irrespective of the formation of a natural oxide film on the substrate 2, the first buffer layer 7 made of YSZ with (100) orientation in a cubic crystal system is formed on the substrate 2 by epitaxial growth.

In addition, as another method for making the constituent atoms of YSZ driven out of the target rather than the method of radiating laser light onto the surface of the target as described above, a method of radiating (incidence), for example, argon (inert gas) plasma, electron beam or etc., onto the surface of the target can be employed. Among these methods, the method of irradiating laser light onto the surface of the target is most preferable. According to this method, it is possible to easily and reliably make atoms driven out of the target by using a simply structured vacuum apparatus with an entrance window of laser light.

As laser light used for irradiating the target, pulsed light whose wavelength is about 150 to 300 nm and whose pulse duration is about 1 to 100 ns is suitable. Specifically, excimer lasers such as an ArF excimer laser, a KrF excimer laser and a XeCl excimer laser and, a YAG laser, a $YVO_4$ laser, a $CO_2$ laser, etc. can be exemplified. Among them, an ArF excimer laser or a KrF excimer laser is especially suitable. Either of ArF excimer laser and KrF excimer laser is easy to be handled and can make atoms driven out of the target more efficiently.

An ion radiated onto the substrate 2 by an ion-beam assisted method is not specifically limited, and, for example, at least one kind of ions of inert gases such as Ag, He, Ne, Xe and Kr or the ions mixed with oxygen can be used. As an ion source for this ion beam, it is preferable to use a Kauffman ion source, etc., for example. By using this ion source, it is possible to comparatively easily generate an ion beam.

The incident (radiation) angle, i.e., the predetermined angle mentioned above, of the ion beam onto the substrate 2, is not specifically limited, and it is preferable to be inclined at angle of about 35 to 65° with respect to the surface of the substrate 2. Especially, when forming the first buffer layer 7 using a metallic oxide of an NaCl structure as a main substance, it is preferable that the radiation angle is about 42 to 47°, and when forming the first buffer layer 7 using a metallic oxide of a fluorite structure as a main substance, it is preferable that the radiation angle is about 52 to 57°. In this embodiment, since the first buffer layer 7 is formed of YSZ which is a metallic oxide of a fluorite structure, it is preferable that the radiation angle is about 52 to 57°, especially 55°. By radiating ion beams onto the substrate 2 at such a radiation angle, the first buffer layer 7 with (100) orientation can be formed well.

While making ions such as argon incident from the direction (111) onto the target, laser ablation is carried out. However, when the first buffer layer 7 is formed of a metallic oxide of an NaCl structure, such as MgO, the laser ablation is carried out while making ions such as argon etc. incident from the direction (110) onto the target.

The conditions employed for forming the first buffer layer 7 is not specifically limited as long as the first buffer layer 7 is formed by epitaxial growth, and the following conditions can be employed, for example.

As the frequency of laser light, it is preferable to be 30 Hz or less, and it is more preferable to be 15 Hz or less. As the energy density of laser light, it is preferable to be 0.5 $J/cm^2$ or more and it is more preferable to be 2 $J/cm^2$ or more.

For the accelerating voltage of ion beams, it is preferable to be about 100 to 300 V, and it is more preferable to be 150 to 250 V. As the amount of radiation of ion beams, it is preferable to be about 1 to 30 mA, and it is more preferable to be about 5 to 15 mA.

As the temperature of the substrate 2, it is preferable to be about 0 to 50° C., and it is more preferable to be a room temperature (5 to 30° C.). As the distance between the substrate 2 and a target, it is preferable to be 100 mm or less.

As the pressure in the vacuum apparatus, it is preferable to be $133 \times 10^{-1}$ Pa ($1 \times 10^{-1}$ Torr) or less, and it is more preferable to be $133 \times 10^{-3}$ Pa ($1 \times 10^{-3}$ Torr) or less. As the atmosphere in the vacuum apparatus, it is preferable to set the mixture ratio of inert gas and oxygen to be about 300:1 to 10:1 by the volume ratio, and it is more preferable to set the mixture ratio thereof to be about 150:1 to 50:1.

By setting the conditions for forming the first buffer layer 7 as described above, the first buffer layer 7 can be more efficiently formed by an epitaxial growth method.

Further, by suitably setting up the radiation time of laser light and ion beams, the average thickness of the first buffer layer 7 can be adjusted to the thickness mentioned above, i.e., about 1 μm. The radiation time of laser light and ion beams is varied depending on the above-mentioned conditions, and usually, it is preferable to be 200 seconds or less and it is more preferable to be 100 seconds or less.

According to this method of forming the first buffer layer 7, by employing the ion-beam assisted method which adjusts the radiation angle of ion beams, it is possible to satisfactorily form the first buffer layer 7 with (100) orientation in a cubic crystal system as described above, irrespective of whether or not a natural oxide film is formed on the surface of the substrate 2. In addition, according to this method, since the orientation of the first buffer layer 7 can be arranged with sufficient accuracy, the average thickness of the first buffer layer 7 can also be made smaller, if necessary.

Figure 5:
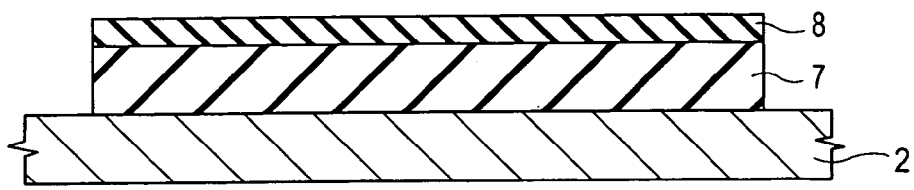
FIG. 5 is a sectional view schematically illustrating a manufacturing process of the piezoelectric element according to the first embodiment of the present invention.

(3) Next, as shown in FIG. 5, the second buffer layer 8 is formed on the first buffer layer 7. Unlike the first buffer layer 7 which is formed on the natural oxide film, since the second buffer layer 8 is formed on the first buffer layer 7 which has a good crystal structure, a laser ablation method is used rather than an ion-beam assisted method. That is, rather than the target for the first buffer layer 7, a target for the second buffer layers 8 which has a composition of the desired $CeO_2$ or the composition approximate thereto. Then, when laser light is radiated onto the target for the second buffer layer 8, oxygen and metal elements come to be driven out of the target, thereby generating a plume. Then, the plume is emitted toward and is caused to contact with the first buffer layer 7 formed on the substrate 2. Consequently, the second buffer layer 8 is formed on the first buffer layer 7 by an epitaxial growth method.

The conditions employed for a laser ablation method of forming the second buffer layer 8 can be set as same as those employed for a laser ablation method of forming the first buffer layer 7.

Figure 6:
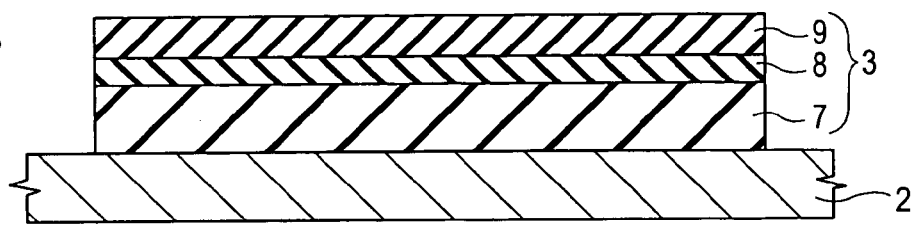
FIG. 6 is a sectional view schematically illustrating a manufacturing process of the piezoelectric element according to the first embodiment of the present invention.

(4) Next, as shown in FIG. 6, the third buffer layer 9 is formed on the second buffer layer 8. In this way, the buffer layer 3 comprised of the first buffer layer 7, the second buffer layer 8, and the third buffer layer 9 can be obtained. In order to form the third buffer layer 9, the laser ablation method is independently used as in the second buffer layer 8. That is, instead of the target for the second buffer layer 8, a target for the third buffer layer 9 with a composition of a desired $Yba_2Cu_3O_x$ or the composition approximate thereto is prepared. Then, when laser light is radiated onto the target for the third buffer layer 9, oxygen and metal elements are driven out of the target, thereby generating a plume. Then, the plume is emitted toward and contacts with the surface of the second buffer layer 8 formed on the substrate 2. Consequently, the third buffer layer 9 is formed on the second buffer layer 8 by an epitaxial growth method.

In addition, if necessary, the third buffer layer 9 can also be formed by an ion-beam assisted method, similar to the process for forming the first buffer layer 7. That is, the third buffer layer 9 can be formed on the second buffer layer 8 by radiating ion beams onto the surface of the second buffer layer 8. By using an ion-beam assisted method, it is possible to more efficiently form the third buffer layer 9.

The conditions for forming the third buffer layer 9 is specifically limited as long as various metal atoms reach the second buffer layer 8 at a predetermined ratio (i.e., a composition ratio in the metallic oxide which has a perovskite structure), and the third buffer layer 9 is formed by an epitaxial growth method. For example, the following conditions are employable.

As the frequency of laser light, it is preferable to be about 30 Hz or less, and it is more preferable to be 15 Hz or less. As the energy density of laser light, it is preferable to be 0.5 $J/cm^2$ or more, and it is more preferable to be 2 $J/cm^2$ or more.

As the temperature of the substrate 2, it is preferable to be about 300 to 800° C., and it is more preferable to be about 700° C. When using ion beam radiation together, the temperature is preferably about 0 to 50° C., and more preferably, a room temperature (5 to 30° C.). As the distance between the substrate 2 and a target, it is preferable to be 60 mm or less, and it is more preferably to be 45 mm or less.

Further, the pressure in vacuum apparatus is preferable to be 1 atmospheric pressure or less, and among them, the partial pressure of oxygen is preferable to be about $399 \times 10^{-2}$ Pa ($3 \times 10^{-2}$ Torr). When using ion beam irradiation together, the pressure in vacuum apparatus is preferably $133 \times 10^{-1}$ Pa ($1 \times 10^{-1}$ Torr) and more preferably, $133 \times 10^{-3}$ Pa ($1 \times 10^{-3}$ Torr). In this case, as the atmosphere in the vacuum apparatus, the mixture ratio of the inert gas and oxygen is preferably about 300:1 to 10:1 by the volume ratio, and more preferably, about 150:1 to 50:1.

By setting the conditions for forming the third buffer layer 9 as described above, the third buffer layer 9 can be more efficiently formed by an epitaxial growth method. In this case, by suitably setting up the radiation time of laser light and ion beams, the average thickness of the third buffer layer 9 can be adjusted to the above-mentioned thickness, i.e., about 30 nm. The radiation time of laser light is varied depending on the above-mentioned conditions, but usually, it is preferable to be about 3 to 90 minutes and it is more preferable to be about 15 to 45 minutes.

Figure 7:
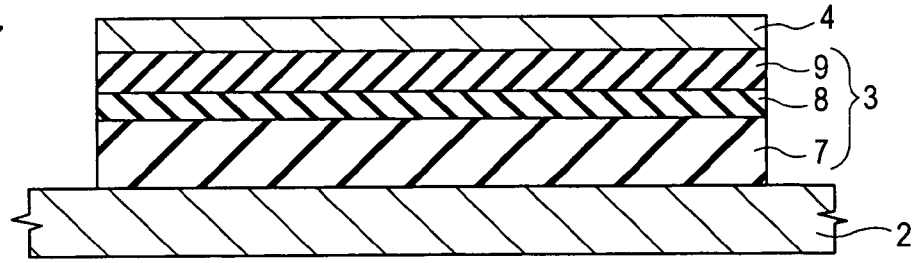
FIG. 7 is a sectional view schematically illustrating a manufacturing process of the piezoelectric element according to the first embodiment of the present invention.

(5) Next, as shown in FIG. 7, the lower electrode 4 is formed on the third buffer layer 7 (buffer layer 3). The lower electrode 4 can be formed by, for example, a sputtering method or a vacuum vapor deposition method. A lower electrode made of Pt as a main component can be used as the lower electrode 4. In addition, the material for the lower electrode 4 is not limited, and well-known conventional materials such as Ir, $IrO_x$, $SrRuO_3$, Nb—$SrTiO_3$, La—$SrTiO_3$, or Nb—$(La, Sr)CoO_3$, etc. can also be used, for example. Here, Nb—$SrTiO_3$ is obtained by doping $SrTiO_3$ with Nb, La—$SrTiO_3$ is obtained by doping $SrTiO_3$ with La, and Nb—$(La, Sr)CoO_3$ is obtained by doping $(La, Sr)CoO_3$ with Nb.

For example, when the lower electrode 4 is formed using Pt with (111) orientation and the piezoelectric film 5 is formed thickly on the lower electrode 4 with the thickness of 100 nm or more, the piezoelectric film 5 has preferred (100) orientation during the film forming process, and thus, the piezoelectric film 5 with preferred (100) orientation in a pseudo-cubic crystal system can be obtained.

Figure 8:
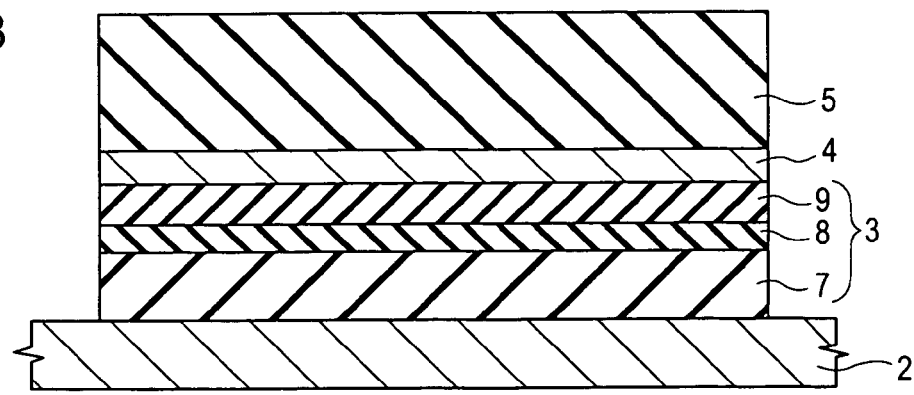
FIG. 8 is a sectional view schematically illustrating a manufacturing process of the piezoelectric element according to the first embodiment of the present invention.

(6) Next, as shown in FIG. 8, the piezoelectric film 5 is formed on the lower electrode 4. Although this embodiment has been described about the case where the piezoelectric film 5 made of $Pb_{1-b}(Zr, Ti)_{1-a}X_aO_3$ (i.e., "PZTX"), the same forming method can be applied to the case where the piezoelectric film 5 has other composition formula as described above.

First, using first to third source solutions containing at least one of Pb, Zr, Ti and X, the first to third source solutions are mixed with each other at a desired ratio so as to meet the desired composition ratio of the piezoelectric film 5. This mixed solution (precursor solution) is arranged on the lower electrode 4 by a coating method such as a spin coating method or a liquid drop discharge method. Then, a heat treatment such as, for example, baking is performed so that oxides contained in the precursor solution are crystallized, thereby obtaining the piezoelectric film 5.

More specifically, first, a series of processes including a precursor solution coating process, a dry heat treatment process, and a degreasing heat treatment process are performed repeatedly as desired. Then, by performing a crystallization annealing process, the piezoelectric film 5 is formed.

The source solution used for preparing the precursor solution is made by mixing organic metals, which contain each constituent metal of PZTX, at the ratio capable of meeting the desired mole ratio of each metal, and dissolving or dispersing them in an organic solvent such as alcohol.

As an organic metal which contains the constituent metal of PZTX, an organic metal such as a metal alkoxide and an organic salt can be used. Specifically, as carboxylate or acetylacetonate complex containing constituent metals of PZTX, the following materials can be exemplified.

As an organic metal containing lead (Pb), a lead acetate etc. can be used, for example. As an organic metal containing zirconium (Zr), zirconium butoxide etc. can be used for example. As an organic metal containing titanium (Ti), titanium isopropoxide etc. can be exemplified. As an organic metal containing vanadium (V), vanadium acetylacetonate oxide etc. can be used, for example. As an organic metal containing niobium (Nb), niobium ethoxide etc. can be used, for example. As an organic metal containing tantalum (Ta), tantalum ethoxide etc. can be used, for example. As an organic metal containing chromium (Cr), chromium (III) acetylacetonate etc. can be used, for example. As an organic metal containing molybdenum (Mo), molybdenum (II) acetic acid etc. can be used, for example. As an organic metal containing tungsten (W), tungsten hexacarbonyl etc. can be used, for example. In addition, organic metals containing constituent metals of PZTX are not necessarily limited to those mentioned above.

As a first source solution, a solution where a condensation polymer for forming the $PbZrO_3$ perovskite crystal by Pb and Zr, among constituent metal elements of PZTX, is dissolved in a solvent such as n-buthanol in an anhydrous state.

As a second source solution, a solution where a condensation polymer for forming the $PbTiO_3$ perovskite crystal by Pb and Ti, among constituent metal elements of PZTX, is dissolved in a solvent such as n-buthanol in an anhydrous state.

As a third source solution, a solution where a condensation polymer for forming the $PbXO_3$ perovskite crystal by Pb and X, among constituent metal elements of PZTX, is dissolved in a solvent such as n-buthanol in an anhydrous state. In addition, when X consists of two or more kinds of elements, the third source solution can be comprised of a plurality of source solutions. For example, when X consists of three elements, V, Nb and Ta, the third source solution can be comprised of three source solutions. Specifically, for example, the third source solution can be comprised of (i) a solution where a condensation polymer for forming the $PbVO_3$ perovskite crystal by Pb and V is dissolved in a solvent such as n-buthanol in an anhydrous state, (ii) a solution where a condensation polymer for forming the $PbNbO_3$ perovskite crystal by Pb and Nb is dissolved in a solvent such as n-buthanol in an anhydrous state, and (iii) a solution where a condensation polymer for forming the $PbTaO_3$ perovskite crystal by Pb and Ta is dissolved in a solvent such as n-buthanol in an anhydrous state.

To the source solution, if necessary, various additives such a stabilizing agent can be added. Moreover, in order to perform hydrolysis or polycondensation on the source solution, an acid or base can be added as a catalyst along with a suitable quantity of water.

In the coating process of the precursor solution, a mixed solution is coated by using a coating method such as spin coating. First, the mixed solution is dropped on the lower electrode 4. Spinning is performed in order to spread the dropped solution all over the lower electrode 4. The number of revolutions can be adjusted to about 500 rpms at an early stage and then increased to about 2000 rpm so as not to cause irregular coating. In this way, the coating can be completed.

In the dry heat treatment process, heat treatment (drying treating) is performed using a hot plate in an ambient atmosphere, at a higher temperature than the boiling point of the solvent used for the precursor solution by about 10° C., for example. The dry heat treatment process can be performed, for example, at a temperature of 125 to 180° C.

In the degreasing heat treatment process, in order to decompose or remove ligands of the organic metals used for the source solution, heat treatment is performed using a hot plate in an ambient atmosphere at a temperature of about 350 to 400° C.

In the crystallization annealing process, i.e., the baking process for crystallization, heat treatment is performed at about 600° C. in an oxygen atmosphere. For example, this heat treatment can be performed by rapid thermal annealing (RTA).

In forming the piezoelectric film 5, it is preferable to add $PbSiO_3$ silicate at a rate between 1 molar percent or more and 5 molar percent or less. Thereby, the crystallization energy of the piezoelectric film 5 can be reduced. That is, for example, when using PZTX as the piezoelectric film 5, by adding $PbSiO_3$ silicate along with X, it is possible to reduce the crystallization temperature of PZTX. Specifically, in addition to the first to third source solutions, a fourth source solution can be used. As the fourth source solution, a solution where a polycondensation solution for forming $PbSiO_3$ crystal is dissolved in a solvent such as n-buthanol in an anhydrous state. As an additive for promoting crystallization, germanate can be used. When forming the piezoelectric film 5, by using the $PbSiO_3$ silicate or germanate, the piezoelectric film 5 may contain Si, or both of Si and Ge. In detail, the piezoelectric film 5 can contain Si or Si and Ge at a ratio of 0.5 molar percent or more and less than 5 molar percent.

The thickness of the piezoelectric film 5 after sintering can be about 500 to 1500 nm. In addition, although the above embodiment has been described in connection with the example in which a piezoelectric film 5 is formed by a liquid phase method, it can be applicable to a gas phase method such as a sputtering method, a molecule beam epitaxial method, a laser ablation method, etc. Further, when partially replacing Pb located at the A site of the perovskite crystal structure in the piezoelectric film 5 with an element of lantanoids, for example, as described above, a source solution is prepared using an organic metal containing an element of lantanoids, and then the piezoelectric film 5 can be formed using the source solution. In detail, as an organic metal containing an element of lantanoids, the followings can be exemplified.

As an organic metal containing lanthanum (La), lanthanum acetylacetonate dihydrate etc. can be used. As an organic metal containing. neodymium (Nd), neodymium (III) acetate monohydrate can be used. As an organic metal containing cerium (Ce), cerium (III) acetic acid hydrate (I) etc. can be used. As an organic metal containing samarium (Sm), samarium (III) acetate hydrate (IV) etc. can be used. As an organic metal containing praseodymium (Pr), praseodymium (III) acetate hydrate etc. can be used. In addition, organic metals containing an element of lanthanoid series are not limited to those mentioned above.

(7) Next, as shown in FIG. 1, the upper electrode 6 is formed on the piezoelectric film 5. The upper electrode 6 can be formed by, for example, a sputtering method or a vacuum vapor deposition method. It is preferable to use Pt as a main component as the upper electrode 6. By using Pt as a main component as the upper electrode 6, it is possible to positively make the piezoelectric film 5 suffer a loss. This is because the diffusion coefficient of Pb in Pt is large. By making Pb suffer a loss, it becomes easy to add X in the piezoelectric film 5. That is, X can be added by a desired amount. Consequently, the piezoelectric film 5 can have a good insulation property. As described above, this is also applicable to the case where Pt as a main component is employed as the lower electrode 4. In addition, as an upper electrode 6, it is not limited to Pt, and well-known conventional electrode materials such as Ir, $IrO_x$, $SrRuO_3$, Nb—$SrTiO_3$, La—$SrTiO_3$ and Nb—$(La, Sr)CoO_3$ can be also employed.

(8) Next, if necessary, post-annealing can be performed in an oxygen atmosphere by RTA. Thereby, it is possible to form a satisfactory interface between the upper electrode 6 and the piezoelectric film 5, and to improve the crystallinity of the piezoelectric film 5.

Using the above processes, it is possible to manufacture a piezoelectric film and a piezoelectric element according to the embodiment of the present invention.

1-3. Operation and Advantages

According to the piezoelectric element 1 of the present invention, since the piezoelectric film 5 has good piezoelectric properties, a piezoelectric element 1 also becomes highly efficient. Especially, since the insulation properties of the piezoelectric film 5 are good, the repeated durability of the piezoelectric element 1 is significantly improved.

The piezoelectric constant ($d_{31}$) of the piezoelectric film 5 according to this embodiment can be, for example, about 200 pC/N as an absolute value. The leak current of the piezoelectric element 1 according to this embodiment can be less than $10^{-5}$ A/cm$^2$ when, for example, input voltage is 100 kV/cm. The repeated durability of the piezoelectric element 1 according to this embodiment can guarantee $1 \times 10^9$ times when input voltage is 300 kV/cm.

1-4. Experiment 1

Based on the manufacturing method of the above-mentioned piezoelectric element, the piezoelectric element 1 was produced as follows.

First, the substrate 2, made of silicon, whose surface includes a (110) plane, was prepared. Then, the substrate 2 was loaded into a substrate holder and placed in a vacuum apparatus (not shown). In the vacuum apparatus, various targets were arranged to face the substrate 2 with a predetermined distance from each other, such as targets for the buffer layers each of which includes constituent elements comprised of the buffer layers 7, 8 and 9, respectively, and targets for the lower electrode 4 and the upper electrode 6 each of which includes constituent elements consisting thereof respectively. As a target for the first buffer layer 7, a desired YSZ composition was used. As a target for the second buffer layer 8, a desired CeO$_2$ composition was used. As a target for the third buffer layer 9, a desired YBa$_2$Cu$_3$O$_x$ composition was used. As targets for the lower electrode 4 and the upper electrode 6, SrRuO$_3$ compositions were used, respectively.

Next, the first buffer layer 7 made of YSZ with (100) orientation in a cubic crystal system was formed by epitaxial growth on the substrate 2 using an ion-beam assisted method. As the laser light radiated onto the target, a KrF laser whose wavelength is 248 nm and whose pulse duration is 20 ns was used.

As the ion beam radiated onto the surface of the substrate 2 by an ion-beam assisted method, Argon ions were used. As the ion source of the ion beam, Kauffman ions were used.

The radiation (incidence) angle of the ion beam onto the surface of the substrate 2 was inclined by 55° with respect to the surface of the substrate 2.

The frequency of the laser light was set to 10 Hz. The energy density of the laser light was set to 2.0 J/cm$^2$. The accelerating voltage of the ion beam was set to 200 V. The radiation amount of the ion beam was set to 8 mA. The temperature of the substrate 2 was set to 30° C. The distance between the substrate 2 and the target was set to 70 mm. The pressure in the vacuum apparatus was set to $1 \times 10^{-3}$ Torr. As an atmosphere in vacuum apparatus, the mixture ratio of inert gas and oxygen was set to 10:1 by the volume ratio. The average thickness of the first buffer layer 7 was 1 μm.

Then, the second buffer layer 8 was formed on the first buffer layer 7. A laser ablation method was used for forming the second buffer layer 8. A desired CeO$_2$ composition was used for the target for the second buffer layer 8.

The conditions of the laser ablation method for forming the second buffer layer 8 were the same as those applied to the laser ablation method employed for forming the first buffer layer 7.

Then, the third buffer layer 9 was formed on the second buffer layer 8. A laser ablation method was used as forming the third buffer layer 9. A desired Yba$_2$Cu$_3$O$_x$ composition was used for the target for the third buffer layer 9.

The frequency of the laser light was set to 10 Hz. The energy density of the laser light was set to 2.0 J/cm$^2$. The temperature of the substrate 2 was set to 700° C. The distance between the substrate 2 and the target was set to 70 mm. The pressure in the vacuum apparatus was set to $1 \times 10^{-2}$ Torr. The average thickness of the third buffer layer 9 was set to 10 nm.

Next, the lower electrode 4 was formed on the third buffer layer 7 (buffer layer 3). The lower electrode 4 was formed by a sputtering method. Pt was used as the lower electrode 4.

Then, the piezoelectric film 5 was formed on the lower electrode 4. First, using the first to fourth source solutions, which will be described below, the first to fourth source solutions were mixed with each other at such a desired ratio that the piezoelectric film 5 can have a desired composition. This mixed solution (precursor solution) was coated on the lower electrode 4 by a spin coating method. Then, heat treatment was performed using baking etc., thereby obtaining the piezoelectric film 5.

In more detail, a series of processes of a precursor solution coating process, a dry heat treatment process, and a degreasing heat treatment process were carried out a desired number of times. Then, by performing a crystallization annealing process, the piezoelectric film 5 was formed.

As the first source solution, a solution made by mixing lead acetate and zirconium butoxide with each other at a ratio of 110:100 and then dissolving the mixture in a solvent such as n-butanol in an anhydrous state can be used. As the second source solution, a solution made by mixing lead acetate and titanium isopropoxide with each other at a ratio of 110:100 and then dissolving the mixture in a solvent such as n-butanol in an anhydrous state can be used. As the third source solution, a solution made by mixing lead acetate and niobium ethoxide with each other at a ratio of 110:100 and then dissolving this mixture in a solvent such as n-butanol in an anhydrous state can be used. As the fourth source solution, a solution made by mixing lead acetate and tetra-n-butoxy silane with each other at a ratio of 110:100 and then dissolving the mixture in a solvent such as n-butanol in an anhydrous state can be used. By mixing the first source solution, second source solution, third source solution and fourth source solution with each other at a ratio of 45:35:20:1, the precursor solution was obtained.

In the precursor solution coating process, the mixed solution was coated by a spin coating method. First, the mixed solution was dropped onto the lower electrode 4. A spinning process was performed in order to spread the dropped solution all over the lower electrode 4. The number of revolutions in the spinning process was adjusted to about 500 rpms at an early stage and increased to about 2000 rpms so as to prevent irregular coating from occurring. In this way, the coating was completed.

In the dry heat treatment process, heat treatment was performed using a hot plate in an ambient atmosphere at a temperature of 125° C. for 10 minutes. In the degreasing heat treatment process, heat treatment was performed using a hot plate in an ambient atmosphere at a temperature of 400° C. for 10 minutes. In the baking process for crystallization, heat treatment was performed in an oxygen atmosphere at a temperature of 600° C. for 5 minutes. These heat treatments are performed by rapid thermal annealing (RTA). The thickness of the piezoelectric film 5 after sintering was 1000 nm.

Next, the upper electrode 6 was formed on the piezoelectric film 5. The upper electrode 6 was formed by a sputtering method. As the lower electrode, Pt was used. Then, post-annealing was performed by RTA in an oxygen atmosphere. The post-annealing was performed at a temperature of 600° C. for 10 minutes.

Figure 9:
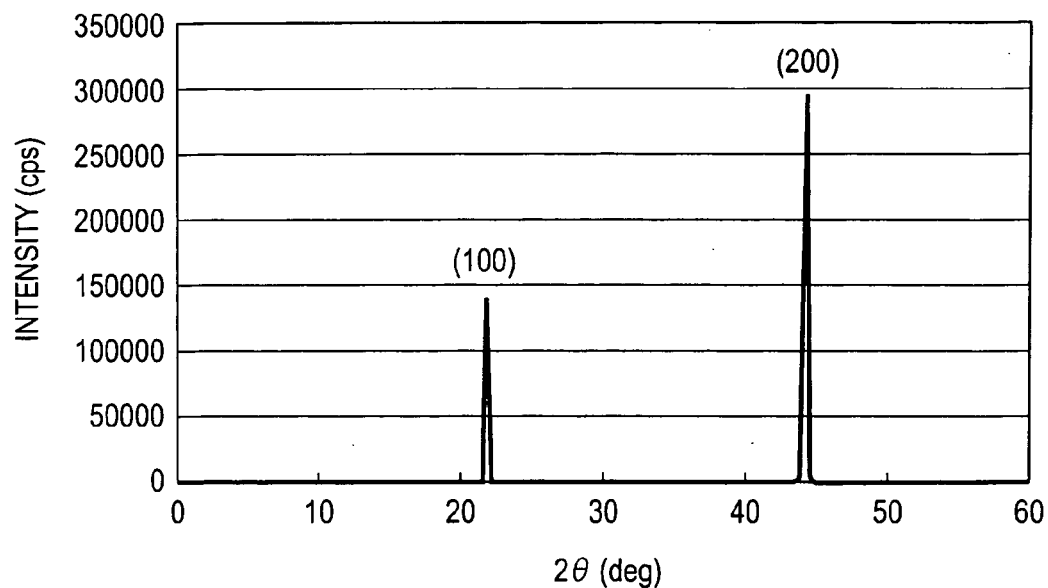
FIG. 9 shows the result of X-ray diffraction.

In the piezoelectric element 1 obtained described above, especially, the piezoelectric film 5 was analyzed by the X-ray diffraction (XRD) method. The result is shown in FIG. 9. From this result, it was proved that the piezoelectric film 5 has (100) orientation in a pseudo-cubic crystal system at a room temperature. Further, from the result of analysis of the piezoelectric film 5 using Raman scattering method, it was proved that the piezoelectric film 5 has a rhombo-hedral structure.

Moreover, the piezoelectric film 5 is represented by the general formula, $Pb_{1-b}(Z_{1-p}Ti_p)_{1-a}Nb_aO_3$, and according to the analysis result by an XPS method, a was 0.20, b was 0.10, and p was 0.44. These numerical values are within the preferable ranges of the above-mentioned a, b, and p.

In addition, the piezoelectric constant ($d_{31}$) of this piezoelectric film 5 was 200 pC/N in absolute value. This value is sufficiently high for driving an ink-jet type recording head. In proportion to the piezoelectric constant, high-density of an ink-jet type recording head and an increase in printing speed can be realized. Further, leak current was less than $10^{-5}$ A/cm$^2$ at 100 kV/cm. This value proves that energy is efficiently transferred to the piezoelectric element 1. Moreover, according to a result measured at 300 kV/cm, it was proved that the repeated durability of the piezoelectric element 1 could guarantee $1 \times 10^9$ times. That is, according to this experiment, the piezoelectric constant ($d_{31}$) after performance of $1 \times 10^9$ times was 200 pC/N in absolute value which is as high as a piezoelectricity value as that at the first stage. That is, there was no change in the piezoelectricity value after $1 \times 10^9$ times.

On the other hand, as a comparative example, a sample was prepared where PZT (Zr:Ti=1:1) was employed for the piezoelectric film 5 and the same measurement was performed. The piezoelectric constant ($d_{31}$) at the early stage was 150 pC/N in an absolute value and the value after $1 \times 10^9$ times was 50 pC/N. Especially, the value after a repeated durability test is very low for driving an ink-jet type recording head. Moreover, leak current was $2 \times 10^{-4}$ A/cm$^2$. Since this value is too high, it is not preferable in view of energy efficiency.

Compared to the present Experiment, the reason why the initial characteristic of the comparative example is low is as follows. In PZT of the comparative example, it is expected that, since there is no Nb which can form a good covalent bond with oxygen, a large number of Pb-oxygen Schottky defects exist, thereby deteriorating ferroelectric property and piezoelectricity. Further, compared to the present Experiment, the reason why the characteristic after the repeated durability test of the comparative example becomes extremely worse is as follows. In PZT of the comparative example, it is expected that, since a large number of Pb-oxygen Schottky defects exist, oxygen ion conduction takes place due to the defects, and pinning of the domain in the electrode interface etc. is caused, the piezoelectric properties of the piezoelectric film 5 deteriorate.

In addition, the measuring method of a piezoelectric constant ($d_{31}$) is as follows. First, in an actual ink-jet type recording head 50 (refer to FIG. 10), the displacement S1 of the piezoelectric film 5 at the time of the voltage input is measured using a laser displacement meter. By comparing values S1 and S2 which can be obtained by the simulation of the piezoelectric displacement according to a finite element method, it is possible to obtain the finite difference between the actual piezoelectric constant ($d_{31}$) of the piezoelectric film 5, and the piezoelectric constant (d'31) of the piezoelectric film 5 assumed by the finite element method. Consequently, the piezoelectric constant ($d_{31}$) of the piezoelectric film 5 can be measured. In addition, physical values needed for the simulation of piezoelectric displacement according to the finite element method are Young's modulus of each film, film stress, and the assumed piezoelectric constant (d'31) of the piezoelectric film 5. According to this experiment, S1 at 30V input was around 400 nm. Moreover, the simulation was performed by setting Young's modulus of the piezoelectric film 5 to 70 GPa and film stress to 110 MPa in tensile stress. In addition, in the following description, the value of a piezoelectric constant ($d_{31}$) will be shown as an absolute value.

1-5. Experiment 2

Using the same method as Experiment 1 mentioned above, the piezoelectric element 1 was formed. However, by mixing (i) a mixed solution of the first source solution and the second source solution with (ii) the third source solution and (iii) the fourth source solution at a ratio of (100-A):A:1, and then varying the value of A, a plurality of precursor solutions were obtained. Further, the mixture ratio of the first source solution and the second source solution was fixed to 60:40.

The ratio of Nb to the sum 1.0 of transition metals on the B site in the piezoelectric film 5 according to this experiment is denoted by the value "a". Further, the deficient amount of Pb is represented by the value "b". Each composition was investigated by an XPS method. The result of the obtained values "b" and piezoelectric constants ($d_{31}$) relative to each "A" and "a" are shown in Table 1. In addition, the piezoelectric constant was measured after a repeated durability test. At the time of a 300 kV/cm input, the repeated durability test was performed by vibration of $1 \times 10^9$ times.

In order to function as a piezoelectric element, the piezoelectric constant ($d_{31}$) is required to be at least 100 pC/N or more. Therefore, it was proved from Table 1 that it is preferable that "a" is $0.05 \leq a \leq 0.3$ and b is $0.025 \leq b \leq 0.15$.

Further, according to the RAMAN scattering method, it was proved that the samples whose values "A" are 0, 5, 10, 15, 20, 25, and 30, respectively, had a rhombo-hedral structure. In addition, the crystal structure of the samples whose values "A" are 35 and 40, respectively, could not be determined.

TABLE 1

| A | a | b | $d_{31}$ (pC/N) |
|---|---|---|---|
| 0 | 0.000 | 0.120 | 50 |
| 5 | 0.051 | 0.024 | 120 |
| 10 | 0.101 | 0.050 | 150 |
| 15 | 0.149 | 0.073 | 210 |
| 20 | 0.200 | 0.100 | 200 |
| 25 | 0.251 | 0.126 | 190 |
| 30 | 0.300 | 0.150 | 100 |
| 35 | 0.352 | 0.177 | 30 |
| 40 | 0.450 | 0.221 | 0 |

1-6. Experiment 3

Using the same method as that in Experiment 1, the piezoelectric element 1 was formed. However, by mixing (i) a mixed solution of the first source solution and the second source solution with (ii) the third source solution and (iii) the fourth source solution at a ratio of 80:20:1, the precursor solutions were obtained. Further, the mixture ratio of the first source solution and the second source solution was set to (100-P):P, and this experiment was performed by varying P as shown in Table 2. In the piezoelectric film 5 obtained from this experiment, the ratio of Zr:Ti is represented by (1−p):p. Each composition was investigated by the XPS method. The piezoelectric constant ($d_{31}$) obtained relative to each "P" and "p" was shown in Table 2. In addition, the piezoelectric constant was measured after a repeated durability test. At the time of 300 kV/cm input, the repeated durability test was performed by vibration of $1 \times 10^9$ times.

In order to function as a piezoelectric element, the piezoelectric constant ($d_{31}$) should have at least 100 pC/N or more. Therefore, it was proved from Table 2 that it is preferable that "p" is $0.2 \leq p \leq 0.6$. Especially, it was proved from Table 2 that the high value of 200 pC/N or more can be acquired when p is $0.4 \leq p \leq 0.5$.

Further, according to the RAMAN scattering method, it was proved that samples whose "P" values were 60, 50, 40, 30, 20, 10, and 0, respectively, had a rhombo-hedral structure. In addition, the sample where the values "P" were 100, 90, 80, and 70, respectively, had a tetragonal structure.

TABLE 2

| P | p | $d_{31}$ (pC/N) |
|---|---|---|
| 100 | 1.00 | 30 |
| 90 | 0.90 | 40 |
| 80 | 0.79 | 50 |
| 70 | 0.70 | 70 |
| 60 | 0.61 | 110 |
| 50 | 0.51 | 200 |
| 40 | 0.40 | 200 |
| 30 | 0.29 | 120 |
| 20 | 0.21 | 100 |
| 10 | 0.10 | 30 |
| 0 | 0.00 | 20 |

2. Second Embodiment

2-1. Ink-jet Type Recording Head

Figure 10:
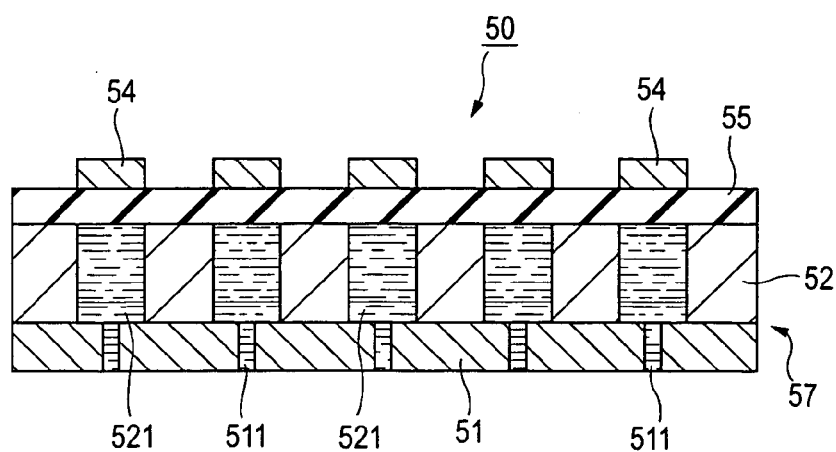
FIG. 10 is a schematic constructional view of an ink-jet type recording head according to a second embodiment of the present invention.
Figure 11:
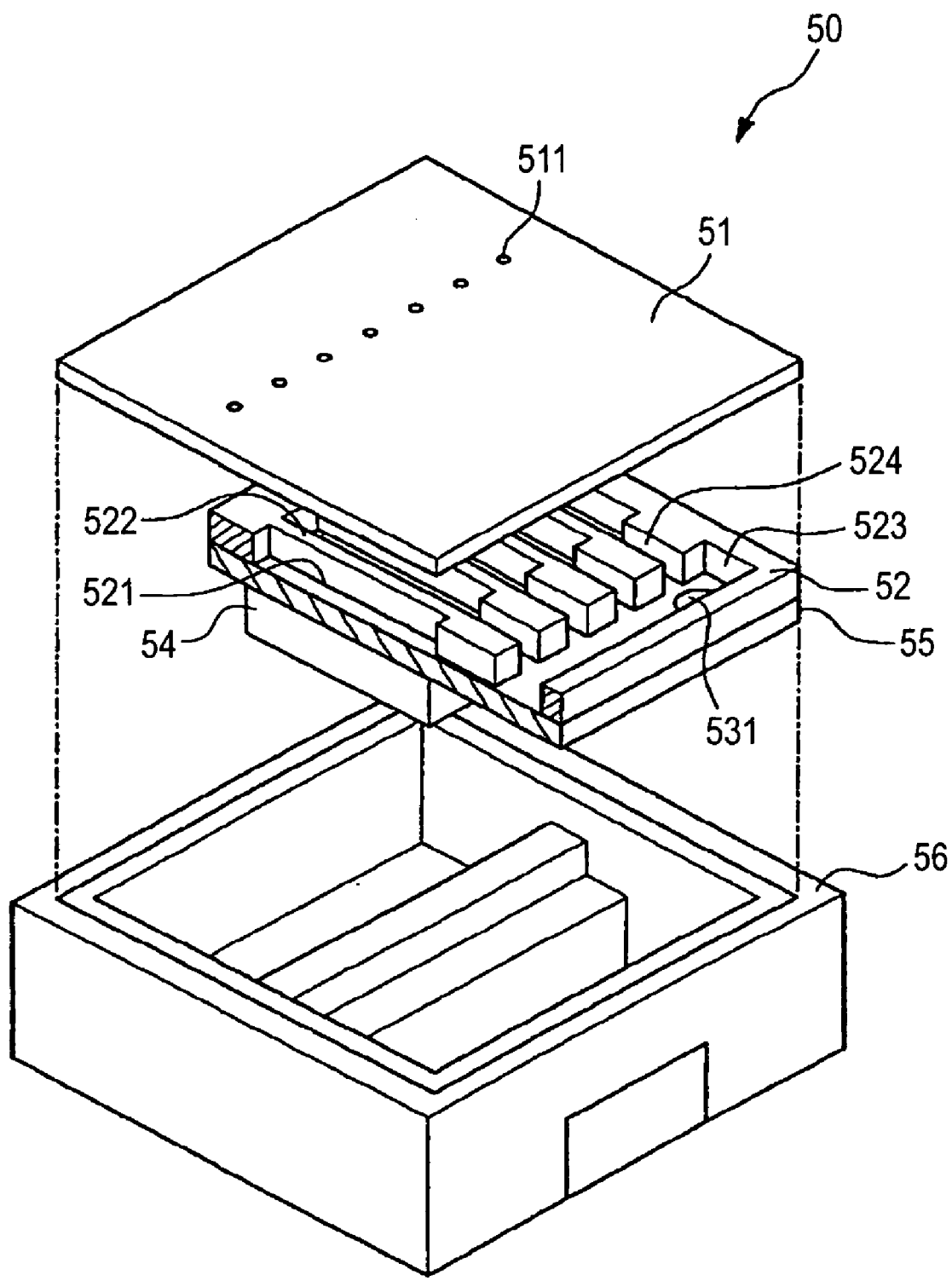
FIG. 11 is an exploded perspective view of the ink-jet type recording head according to the second embodiment of the present invention.

An ink-jet type recording head having a piezoelectric element 1 according to the first embodiment will be described below. FIG. 10 is a sectional side view showing a schematic structure of an ink-jet type recording head according to this embodiment. FIG. 11 is an exploded perspective view of this ink-jet type recording head. In addition, FIG. 11 shows a state in which a usually used state is inverted.

The ink-jet type recording head 50 (hereinafter, simply referred to as "head") includes a head body 57 and a piezoelectric portion 54 formed on the head body 57, as shown in FIG. 10. In addition, the piezoelectric portion 54 shown in FIG. 10 is equivalent to the buffer layer 3, the lower electrode 4, the piezoelectric film 5 and the upper electrode 6 of the piezoelectric element 1 shown in FIG. 1. In the ink-jet type recording head according to this embodiment, the piezoelectric element 1 can function as a piezoelectric actuator. The piezoelectric actuator is an element which has the function to move a certain substance.

Further, the buffer layer 3 of the piezoelectric element 1 shown in FIG. 1 is equivalent to the elastic film 55 shown in FIG. 10. The substrate 2 (refer to FIG. 1) constitutes the principal part of the head body 57.

That is, the head 50 includes a nozzle plate 51, an ink chamber substrate 52, an elastic film 55, and the piezoelectric portion 54 (vibrating source) bonded to the elastic film 55, all of which are received in a base 56. In addition, the head 50 constitutes an on-demand type of piezo jet type head.

The nozzle plate 51 is comprised of, for example, a rolled plate made of stainless steel, etc., and a large number of nozzles 511 are formed in one row in the nozzle plate 51 for discharging ink drops. The pitch between these nozzles 511 can be suitably set according to the printing accuracy.

The ink chamber substrate 52 is anchored (fixed) to the nozzle plate 51. The ink chamber substrate 52 is formed by the substrate 2 (refer to FIG. 1). The ink chamber substrate 52 are formed with a plurality of cavities (ink cavities) 521, a reservoir 523 and supply ports 524, all of which are partitioned by the nozzle plate 51, side walls (partition walls) 522 and the elastic film 55. The reservoir 523 temporarily reserves the ink supplied from an ink cartridge 631 (refer to FIG. 14). Through the supply ports 524, ink is supplied to each cavity 521 from the reservoir 523.

The cavities 521 are arranged corresponding to each nozzle 511, as shown in FIGS. 10 and 11. The volume of the cavities 521 is variable by the vibration of the elastic film 55. Each cavity 521 is structured to discharge ink according to the volume change.

As a base material for obtaining the ink chamber substrate 52, i.e., a substrate 2 (refer to FIG. 1), a silicon single crystal substrate with (110) orientation can be used. Since the silicon single crystal substrate with (110) orientation is suitable for anisotropic etching, it is possible to form the ink chamber substrate 52 easily and certainly. In addition, such a silicon single crystal substrate is used so that the surface on which the buffer layer 3 is formed, i.e., the surface of the elastic film 55, shown in FIG. 1, can include a (110) plane.

The elastic film 55 is formed on the side of the ink chamber substrate 52 opposite to the nozzle plate 51. Moreover, a plurality of the piezoelectric portions 54 are formed on the side of the elastic film 55 opposite to the ink chamber substrate 52. The elastic film 55 is formed by the buffer layer 3 of the piezoelectric element 1 shown in FIG. 1 as described above. As shown in FIG. 11, at a predetermined position of the elastic film 55, a communicating hole 531 is formed to penetrate the elastic film in its thickness direction. By the communicating hole 531, ink is supplied from the ink cartridge 631 to the reservoir 523.

Each piezoelectric portion 54 is electrically connected to a piezoelectric element driving circuit which will be mentioned below, such that it operates (vibrates, deforms) based on a signal from the piezoelectric element driving circuit. That is, each piezoelectric portion 54 functions as a vibration source (head actuator). The elastic film 55 is vibrated by the vibration (deflection) of the piezoelectric portion 54, and functions so as to increase the internal pressure in the cavity 521 momentarily.

The base 56 is formed of, for example, various resinous materials, various metallic materials, etc. As shown in FIG. 11, the ink chamber substrate 52 is fixed to and supported by the base 56.

2-2. Operation of Ink-jet Type Recording Head

Figure 12:
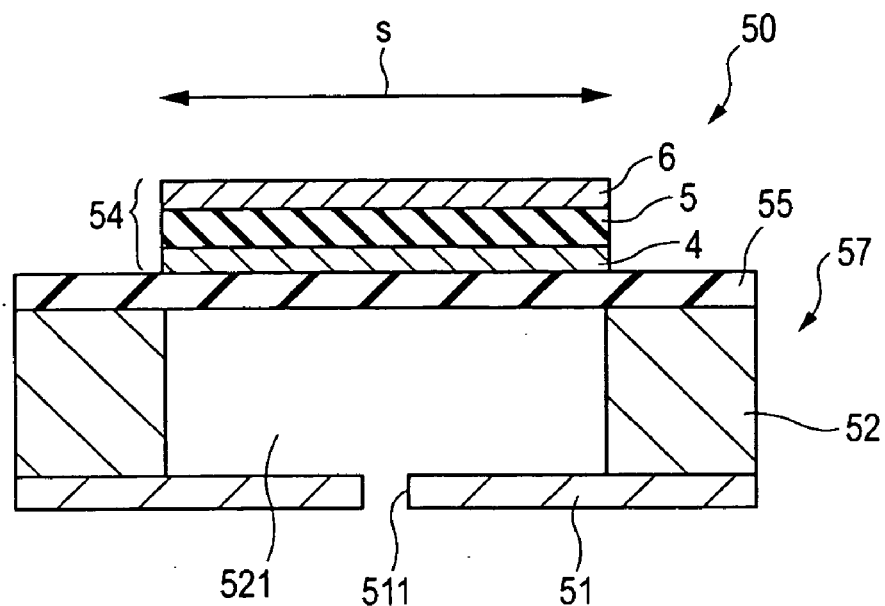
FIG. 12 is a diagram for explaining the operation of the ink-jet type recording head.

Next, the operation of the ink-jet type recording head 50 according to this embodiment will be described. In the head 50 according to this embodiment, in a state in which a predetermined discharge signal is not input through a piezoelectric element driving circuit, i.e., in a state in which any voltage is not input between the lower electrode 4 and the upper electrode 6 of the piezoelectric portion 54, as shown in FIG. 12, deformation does not occur in the head 50. Therefore, no deformation occurs on the elastic film 55 and no volume change occurs in the cavity 521. Thus, an ink drop is not discharged from the nozzle 511.

Figure 13:
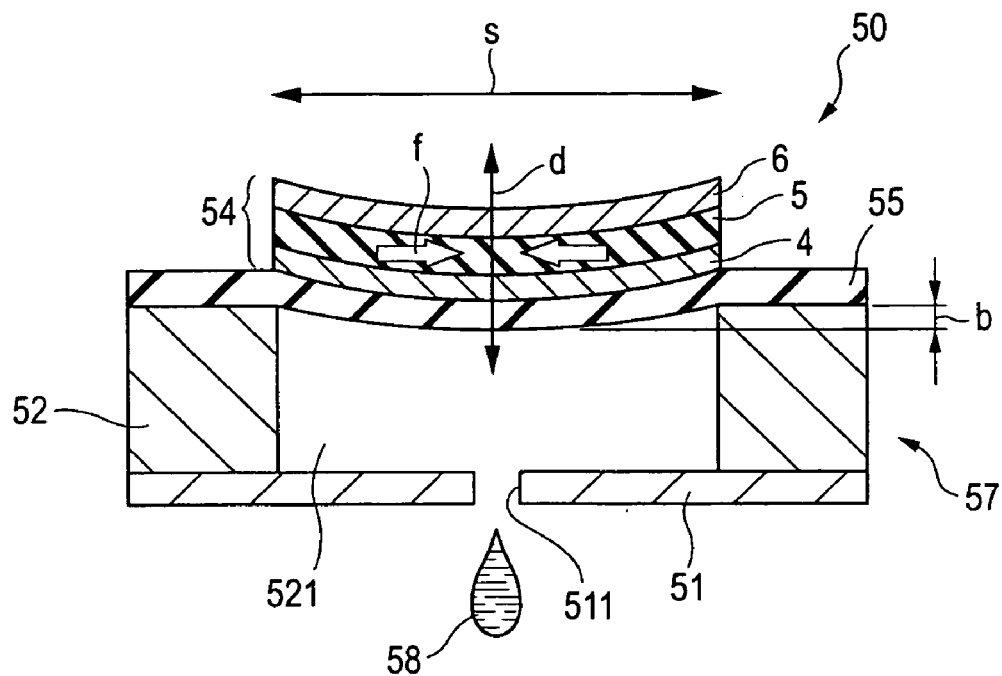
FIG. 13 is a diagram for explaining the operation of an ink-jet type recording head.

On the other hand, in a state in which a predetermined discharge signal is input through the piezoelectric element driving circuit, i.e., in a state in which any voltage is input between the lower electrode 4 and the upper electrode 6 of the piezoelectric portion 54, as shown in FIG. 13,. deflecting deformation occurs in the direction of a minor axis (the direction of the arrow as shown in FIG. 13). Thereby, the elastic film 55 is deflected and a volume change in the cavity 521 occurs. At this time, the pressure in the cavity 521 increases momentarily, and an ink drop 58 is discharged from the nozzle 511.

That is, when a voltage is input, the crystal lattice of the piezoelectric film 5 is stretched in the direction (the direction of the arrow "d" as shown in FIG. 13) perpendicular to the in-plane direction, and, at the same time, is compressed in the in-plane direction. In this state, a tensile stress "f" acts on the piezoelectric film 5. Therefore, the elastic film 55 is bent and deflected. As the displacement of the piezoelectric film 5 (absolute value) increases in the direction of a minor axis of the cavity 521 in the piezoelectric film 5, the deflected amount of the elastic film 55 increases and an ink drop can be discharged more efficiently.

When the discharge of ink is completed, the piezoelectric element driving circuit stops applying a voltage between the lower electrode 4 and the upper electrode 6. Thereby, the piezoelectric portion 54 returns to original form shown in FIG. 12, and the volume of the cavity 521 increases. In addition, at this time, the pressure (pressure in the forward direction) from the ink cartridge 631 to the nozzle 511 is acting on the ink. For this reason, air is prevented from entering the cavity 521 from the nozzle 511, and a proper amount of ink corresponding to the amount of ink to be discharged can be supplied to the cavity 521 through the reservoir 523 from the ink cartridge 631.

In this way, arbitrary (desired) characters, figures, etc. can be printed by sequentially inputting discharge signals through the piezoelectric element driving circuit to the piezoelectric portion 54 located at a position where the discharge of an ink drop is performed.

2-3. Manufacturing Method of Ink-jet Type Recording Head

Next, an example of a manufacturing method of the ink-jet type recording head 50 according to this embodiment will be described.

First, a base material used as the ink chamber substrate 52, i.e., a substrate 2 comprised of a silicon single crystal substrate with (110) orientation is prepared. Then, as shown in FIG. 1 and FIGS. 4 to 8, the buffer layer 3, the lower electrode 4, the piezoelectric film 5 and the upper electrode 6 are sequentially formed on the substrate 2. In addition, as described above, the buffer layer 3 formed as above also serves as the elastic film 55.

Then, as shown in FIGS. 12 and 13, the upper electrode 6, the piezoelectric film 5, and the lower electrode 4 are patterned so as to correspond to each cavity 521, and the piezoelectric portions 54 of the number corresponding to the number of the cavity 521 are formed.

Next, the base material (substrate 2) used as the ink chamber substrate 52 is subject to patterning, recesses serving as the cavities 521 are formed at positions corresponding to the piezoelectric portions 54, and recesses serving as the reservoir 523 and the supply ports 524 are formed at predetermined positions.

In this embodiment, since the silicon substrate (substrate 2) with (110) orientation is used as the base material, wet etching (anisotropic etching) using high-concentration alkaline aqueous solution can be suitably employed. In the case of wet etching using a high-concentration alkaline aqueous solution, it is possible to make the buffer layer 3 serve as an etching stopper as described above. Therefore, the ink chamber substrate 52 can be more easily formed.

By etching the base material (substrate 2) obtained in its thickness direction until the elastic film 55 is exposed, the ink chamber substrate 52 is formed. Here, the remaining portion which is not etched serves as side walls 522. The exposed elastic film 55 will be in a state in which the function as an elastic film can be exhibited.

Then, the nozzle plate 51 having a plurality of nozzles 511 therein is positioned and bonded so that each nozzle 511 corresponds to each recess serving as the cavity 521. Thereby, a plurality of cavities 521, a reservoir 523 and a plurality of supply ports 524 are formed. For bonding of the nozzle plate 51, an adhesion method using an adhesive, a fusing method, etc. can be used, for example. Next, the ink chamber substrate 52 is attached to the base 56.

Using the above processes, an ink-jet type recording head 50 according to this embodiment can be manufactured.

2-4. Operation and Advantages

According to the ink-jet type recording head 50 of this embodiment, as described above, the piezoelectric constant ($d_{31}$) of the piezoelectric film 5 of the piezoelectric portion 54 is high. In this manner, the piezoelectric film is deformed more largely due to a voltage applied. That is, the piezoelectric portion 54 has good piezoelectric properties. Thereby, the deflected amount of the elastic film 55 becomes large, so that an ink drop can be more efficiently discharged. Here, "more efficiently" means that it is possible to discharge the same quantity of an ink drop using a lower voltage. That is, since a drive circuit can be simplified and at the same time, the power consumption can be reduced, it is. possible to form the pitch of the nozzle 511 with higher density. Therefore, high-density printing or high-speed printing can be performed. Moreover, since the length of the major axis of the cavity 521 can be shortened, the head can be miniaturized as a whole.

3. Third Embodiment 3-1. Ink-jet Printer

Figure 14:
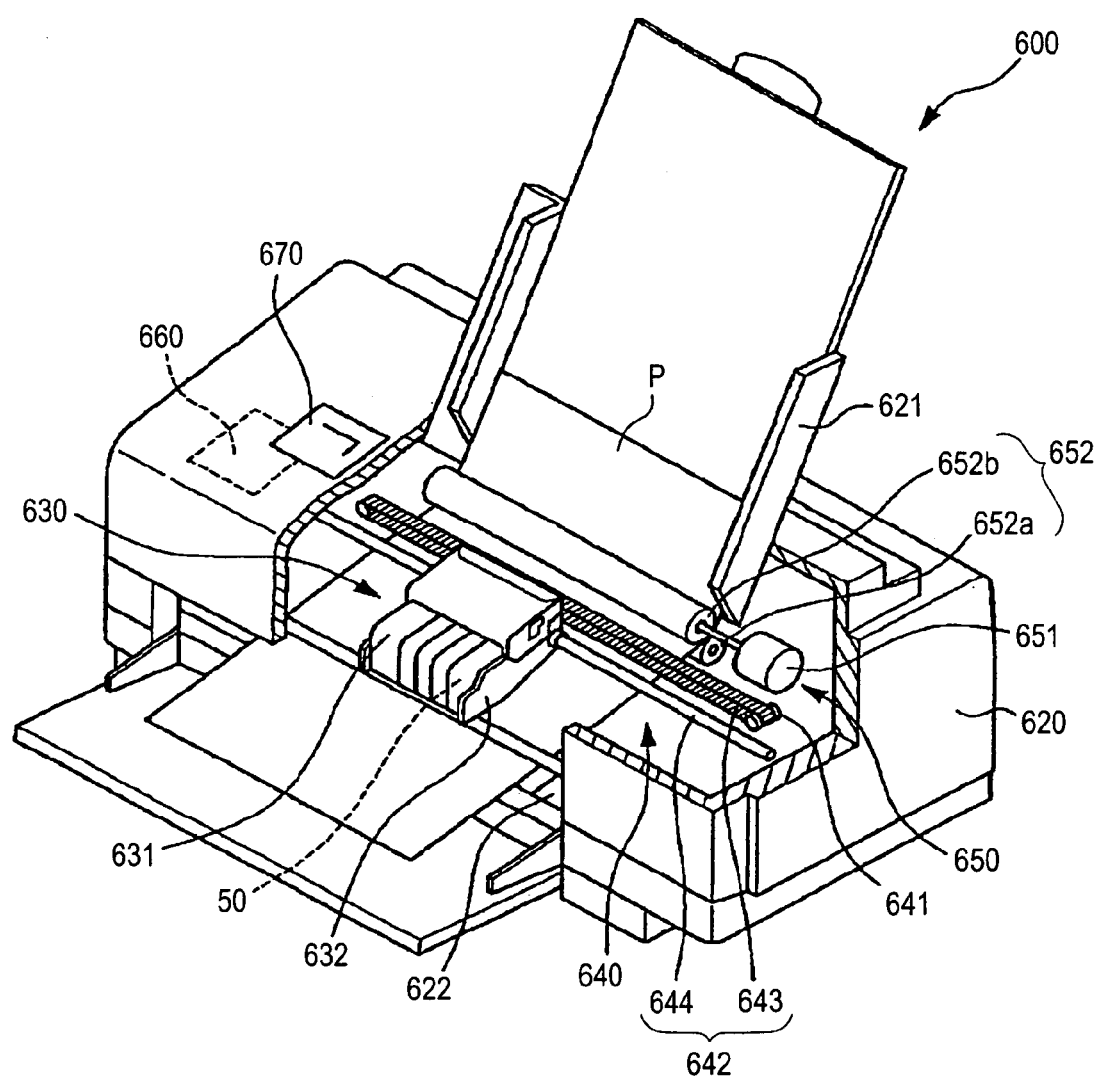
FIG. 14 is a schematic constructional view of an ink-jet printer according to a third embodiment of the present invention.

An ink-jet printer having the ink-jet type recording head 50 according to the second embodiment will be described. FIG. 14 illustrates a schematic structure of an ink-jet printer 600 according to this embodiment. An ink-jet printer 600 can function as a printer capable of printing on a paper, etc. In addition, in the following description, the top in FIG. 14 is called an "upper portion", and the bottom is called a "lower portion".

An ink-jet printer 600 has a device body 620. A tray 621 on which a recording paper P is placed is disposed on the upper rear side of the ink-jet printer. A discharge port 622 is disposed on the lower front side of the ink-jet printer for discharging the recording paper P. An operation panel 670 is disposed on the top face of the ink-jet printer.

Inside the device body 620, a printing unit 640 having a head unit 630 which performs, mainly, a reciprocating motion, a paper feeding. unit 650 which feeds the recording paper P one by one into the printing unit 640, and a control unit 660 which controls the printing unit 640 and the paper feeding unit 650 are provided.

The printing unit 640 includes the head unit 630, a carriage motor 641 which serves as a driving source of the head unit 630, and a reciprocating mechanism 642 which receives a rotational force from the carriage motor 641 to reciprocate the head unit 630.

The head unit 630 has arranged thereunder an ink-jet type recording head 50 having a plurality of nozzles 511, an ink cartridge 631 which supplies ink to the ink-jet type recording head 50, and a carriage 632 which carries the ink-jet type recording head 50 and the ink cartridge 631.

The reciprocating mechanism 642 has a carriage guide shaft 643 whose both ends are supported by frames (not shown), and a timing belt 644 extending parallel to the carriage guide shaft 643. The carriage 632 is reciprocally supported by the carriage guide shaft 643 and is fixed to a part of the timing belt 644. When the timing belt 644 travels in forward and reverse directions through a pulley by the operation of the carriage motor 641, the head unit 630 is reciprocated while being guided by the carriage guide shaft 643. During the reciprocating motion of the head unit, a suitable amount of ink is discharged from the ink-jet type recording head 50, whereby printing on the recording paper P is performed.

The paper feeding unit 650 has a paper feeding motor 651 serving as a driving source, and a paper feeding roller 652 which rotates by the operation of the paper feeding motor 651. The paper feeding roller 652 has a driven roller 652a and a driving roller 652b, which are vertically opposed to each other with a feeding path of the recording paper P (or recording paper P itself) sandwiched therebetween. The driving roller 652b is connected to the paper feeding motor 651.

3-2. Operation and Advantages

According to the ink-jet printer 600 of this embodiment, since it has the ink-jet type recording head 50 which allows high performance and high density of nozzles, a high-density printing and high-speed printing can be performed.

In addition, the ink-jet printer 600 according to the present invention can also be used as a liquid drop discharge apparatus for industrial use. In this case, as an ink (liquid material) to be discharged, various kinds of functional materials adjusted to a suitable viscosity using a solvent or a dispersion medium can be used.

4. Fourth Embodiment 4-1. Piezoelectric Pump

A piezoelectric pump comprising the piezoelectric element 1 according to the first embodiment will be described with reference to the drawings. FIGS. 15 and 16 are schematic sectional views of the piezoelectric pump 20 according to this embodiment. A piezoelectric element of the piezoelectric pump 20 according to this embodiment can function as a piezoelectric actuator. The piezoelectric portion 22 shown in FIGS. 15 and 16 is comprised of the lower electrode 4, the piezoelectric film 5, and the upper electrode 6 of the piezoelectric element 1 shown in FIG. 1, and the buffer layer 3 of the piezoelectric element 1 shown in FIG. 1 serves as a diaphragm 24 shown in FIGS. 15 and 16. Moreover, the substrate 2 (refer to FIG. 1) serves as a base 21 which constitutes the principal part of the piezoelectric pump 20. The piezoelectric pump 20 includes the base 21, the piezoelectric portion 22, a pump chamber 23, a diaphragm 24, an inlet-side check valve 26a, a discharge-side check valve 26b, an inlet port 28a, and a discharge port 28b.

4-2. Operation of Piezoelectric Pump

Next, the operation of the above-mentioned piezoelectric pump will be described below. First, when a voltage is supplied to the piezoelectric portion 22, the voltage is applied to the piezoelectric film 5 in its thickness direction (refer to FIG. 1). Then, as shown in FIG. 15, the piezoelectric portion 22 is deflected in the direction (the direction of the arrow "a" shown in FIG. 15) in which the volume of the pump chamber 23 is widened. Moreover, the diaphragm 24 is also deflected, along with the piezoelectric portion 22, in the direction in which the volume of the pump chamber 23 increases. As a result, the pressure in the pump chamber 23 changes and fluid flows into the pump chamber 23 from the inlet port 28a by the check valve 26a and 26b (the direction of the arrow "b" shown in FIG. 15).

Next, when the supply of voltage to the piezoelectric portion 22 stops, the application of a voltage to the piezoelectric film 5 in its thickness direction also stops (refer to FIG. 1). Then, as shown in FIG. 16, the piezoelectric portion 22 is deflected in the direction (the direction of the arrow "a" shown in FIG. 16) in which the volume of the pump chamber 23 decreases. At the same time, the diaphragm 24 is also deflected along with the piezoelectric portion 22 in the direction in which the volume of the pump chamber 23 decreases. As a result, the pressure in the pump chamber 23 changes and fluid is discharged to the outside from the discharge port 28b by the action of the check valves 26a and 26b (the direction of the arrow "b" shown in FIG. 16).

The piezoelectric pump 20 can be used as a water-cooling module for electronic apparatuses, for example, personal computers, and desirably notebook computers. A water-cooling module uses the above-mentioned piezoelectric pump 20 for driving cooling liquid and includes the piezoelectric pump 20 and circulating water channels, etc.

4-3. Operation and Advantages

According to the piezoelectric pump 20 according to this embodiment, as described above, since the piezoelectric film 5 of the piezoelectric portion 22 has good piezoelectric properties, suction and discharge of fluid can be efficiently performed. Therefore, the piezoelectric pump 20 according to this embodiment can have a large discharge pressure and discharge amount. Further, high-speed operation of the piezoelectric pump 20 becomes possible. Moreover, the piezoelectric pump 20 can be manufactured in compact size as a whole.

5. Fifth Embodiment 5-1. Surface-acoustic-wave Element

Figure 17:
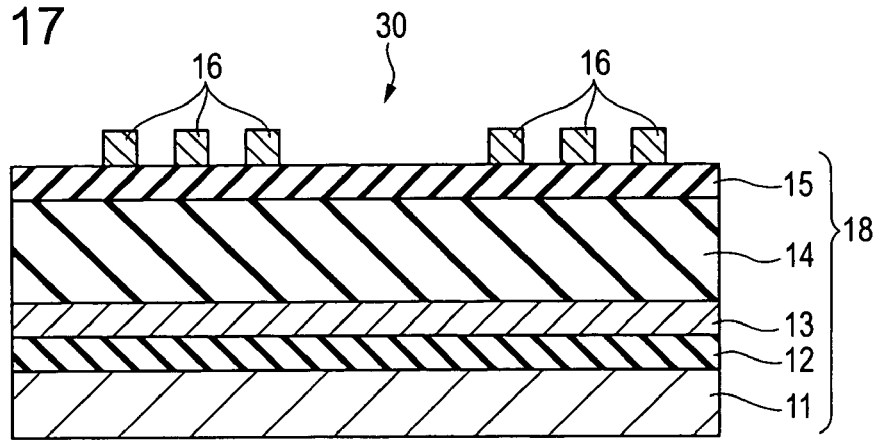
FIG. 17 is a sectional side view of a surface-acoustic-wave element according to a fifth embodiment of the present invention;.

Next, an example of a surface-acoustic-wave element according to the fifth embodiment of the present invention will be described referring to the accompanying drawings. A surface-acoustic-wave element 30 according to this embodiment includes a substrate 11, a buffer layer 12, a conductive layer 13, a piezoelectric film 14, a protective layer 15, and an electrode 16, as shown in FIG. 17. The substrate 11, the buffer layer 12, the conductive film 13, the piezoelectric film 14, and the protective layer 15 constitute the base 18.

As the substrate 11, a single crystal silicon (100) substrate can be used, for example. The buffer layer 12 can be comprised of the buffer layer 3 of the piezoelectric element 1 shown in FIG. 1. The conductive film 13 can be comprised of the lower electrode 4 of the piezoelectric element 1 shown in FIG. 1. The piezoelectric film 14 can be comprised of the piezoelectric film 5 of the piezoelectric element 1 shown in FIG. 1. The protective layer 15, for example, can be comprised of an oxide or a nitride, etc. As the electrode 16, a thin film such as aluminum can be used, for example. The electrode 16 is an inter-digital type electrode (inter-digital transducer: hereinafter, referred to as "IDT electrode"). When the electrode 16 is observed from the upper side, it has a shape, for example, like inter-digital type electrodes 141, 142, 151, 152, and 153 shown in FIGS. 18 and 19.

5-2. Operation and Advantages

According to the surface-acoustic-wave element 30 of this embodiment, since the piezoelectric film 14 comprised of the piezoelectric film 5 of the piezoelectric element 1 shown in FIG. 1 has good piezoelectric properties, the surface-acoustic-wave element 30 also has high performance characteristics.

6. Sixth Embodiment
6-1. Frequency Filter

Figure 18:
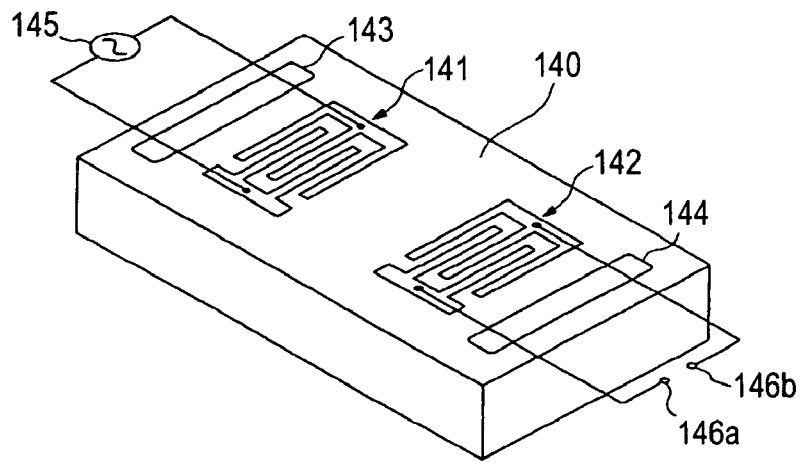
FIG. 18 is a perspective view of a frequency filter according to a sixth embodiment of the present invention.

Next, an example of a frequency filter according to the sixth embodiment of the present invention will be described referring to the accompanying drawings. FIG. 18 schematically illustrates the frequency filter according to this embodiment.

As shown in FIG. 18, the frequency filter has a base 140. As the base 140, the base 18 of the surface-acoustic-wave element 30 shown in FIG. 17 can be used.

The IDT electrodes 141 and 142 are formed on the top face of the base 140. Moreover, sound absorption units 143 and 144 are formed on the base 140 in such a manner that the IDT electrodes 141 and 142 can be disposed therebetween. The sound absorption units 143 and 144 absorb the surface acoustic wave which is propagated on the surface of the base 140. A high frequency signal source 145 is connected to the IDT electrode 141 formed on the base 140, and the signal line is connected to the IDT electrode 142.

6-2. Operation of Frequency Filter

Next, the operation of the above-mentioned frequency filter will be described. In the above-mentioned construction, when a high frequency signal is output from the high frequency signal source 145, the high frequency signal is input to the IDT electrode 141, thereby generating surface acoustic waves on the top surface of the base 140. The surface acoustic waves are propagated from the IDT electrode 141 to the sound absorption unit 143 and are absorbed by the sound absorption unit 143. However, among the surface acoustic waves propagated toward the IDT electrode 142, the surface acoustic waves with a specific frequency which is set according to the pitch of the IDT electrode 142, etc., or with a frequency belonging to a specific band is converted into electric signals, and the converted electrical signal are taken out to terminals 146a and 146b through a signal line. In addition, the sound absorption unit 144 through the IDT electrode 142 absorbs most frequency components other than the above-mentioned specific frequency, and the frequencies belonging to a specific band. Thus, it is possible to select (filter) only surface acoustic waves with a specific frequency or with a frequency belonging to a specific band among the electric signals supplied to the IDT electrode 141 having the frequency filter according to this embodiment.

7. Seventh Embodiment
7-1. Oscillator

Figure 19:
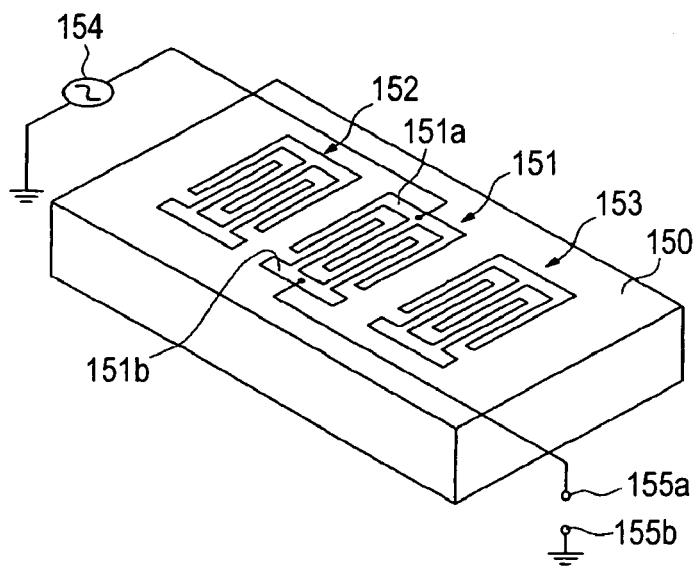
FIG. 19 is a perspective view of an oscillator according to a seventh embodiment of the present invention.

Next, an example of an oscillator according to the seventh embodiment of the present invention will be described with reference to the accompanying drawings. FIG. 19 schematically illustrates an oscillator according to this embodiment.

As shown in FIG. 19, the oscillator has a base 150. As the base 18, the surface-acoustic-wave element 30 shown in FIG. 17 can be used, similar to the above-mentioned frequency filter.

The IDT electrode 151 is formed on the top face of the base 150, and IDT electrodes 152 and 153 are also formed such that the IDT electrode 151 can be disposed therebetween. A high frequency signal source 154 is connected to one comb-shaped electrode 151a, and the signal line is connected to the other comb-shaped electrode 151b. Both of the comb shaped electrodes constitute the IDT electrode 151. In addition, the IDT electrode 151 is equivalent to an electric signal applying electrode, and the IDT electrodes 152 and 153 are respectively equivalent to a resonating electrode which resonates with the specific frequency component of the surface elastic wave generated by the IDT electrode 151, or the frequency component belonging to a specific band.

7-2. Operation of Oscillator

Hereinafter, the operation of the above-mentioned oscillator is described. According to the above-mentioned construction, when a high frequency signal is output from the high frequency signal source 154, the high frequency signal is applied to one comb-shaped electrode 151a of the IDT electrode 151, and thereby, on the surface of the base 150, a surface acoustic wave propagating toward the IDT electrode 152 and a surface acoustic wave propagating toward the IDT electrode 153 are generated. Among these surface acoustic waves, the surface acoustic wave with a specific frequency component is reflected by the IDT electrodes 152 and 153, and thereby, a stationary war is generated between the IDT electrodes 152 and 153. When the surface acoustic wave with a specific frequency component or a frequency component belonging to a specific band is repeatedly reflected by the IDT electrodes 152 and 153, the specific frequency component or the frequency. component belonging to a specific band resonates, and its amplitude increases. A part of surface acoustic wave with the specific frequency component or the frequency component belonging to a specific band is taken out from the comb-shaped electrode 151b of the IDT electrode 151, and the electric signal of the frequency (or frequency which has a certain amount of zone) according to the resonant frequency of the IDT electrodes 152 and 153 can be taken out to the terminals 155a and 155b.

7-3. SAW Oscillator for Voltage Control

Figure 20:
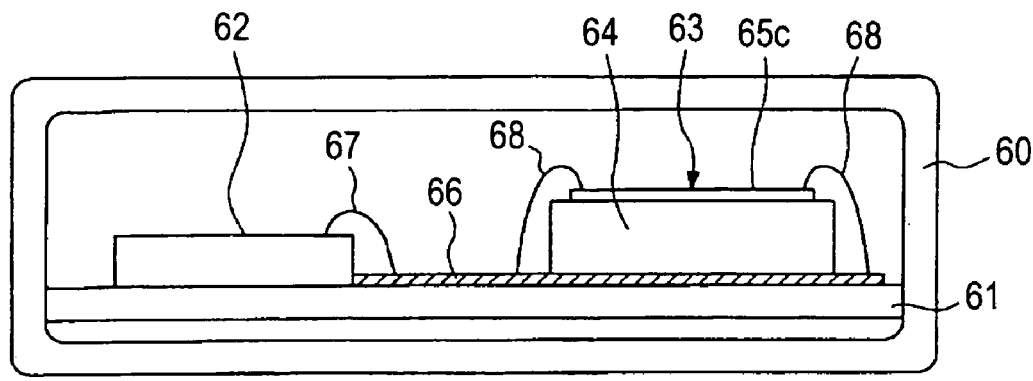
FIG. 20 is a schematic diagram of an example in which the oscillator according to the seventh embodiment of the present invention is applied to VCSO.
Figure 21:
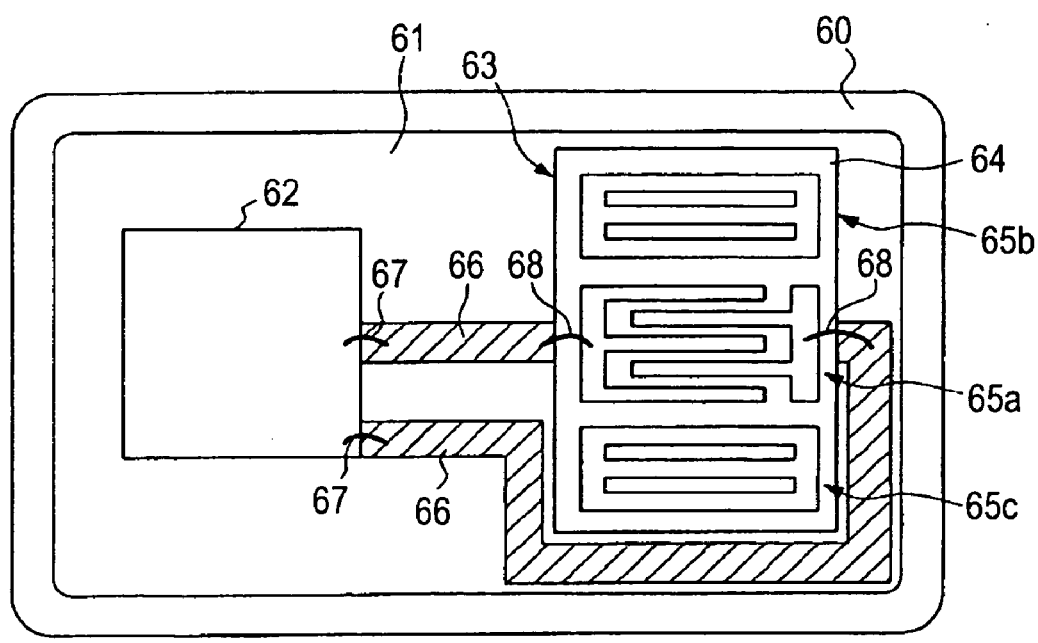
FIG. 21 is a schematic diagram of an example in which the oscillator according to the seventh embodiment of the present is applied to VCSO.

FIGS. 20 and 21 schematically illustrate an example where the above-mentioned oscillator is applied to VCSO (Voltage Controlled SAW Oscillator), and FIG. 20 is a side perspective view and FIG. 21 is a perspective view as seen from the upper side.

The VCSO is mounted inside a metallic housing 60 (made of aluminum or stainless steel). On the substrate 61, an IC (Integrated Circuit) 62 and an oscillator 63 are mounted. In this case, IC 62 is an oscillating circuit for controlling the frequency applied to the oscillator 63 according to the voltage value input from an external circuit (not shown).

The oscillator 63 includes a base 64, and IDT electrodes 65a to 65c respectively formed on the base 64, in almost the same manner as that of the oscillator 63 shown in FIG. 19. As the base 64, the base 18 of the surface-acoustic-wave element 30 shown in FIG. 17 can be used, similar to the above-mentioned oscillator shown in FIG. 19.

On the substrate 61, a wiring 66 for electrically connecting the IC 62 and the oscillator 63 is patterned. The IC 62 and the wiring 66 are. connected by wire lines 67 such as a gold wire, etc., and the oscillator 63 and the wiring 66 are connected by wire lines 68 such as a gold wire. Thereby, the IC 62 and the oscillator 63 are electrically connected to each other through the wiring 66.

Figure 22:
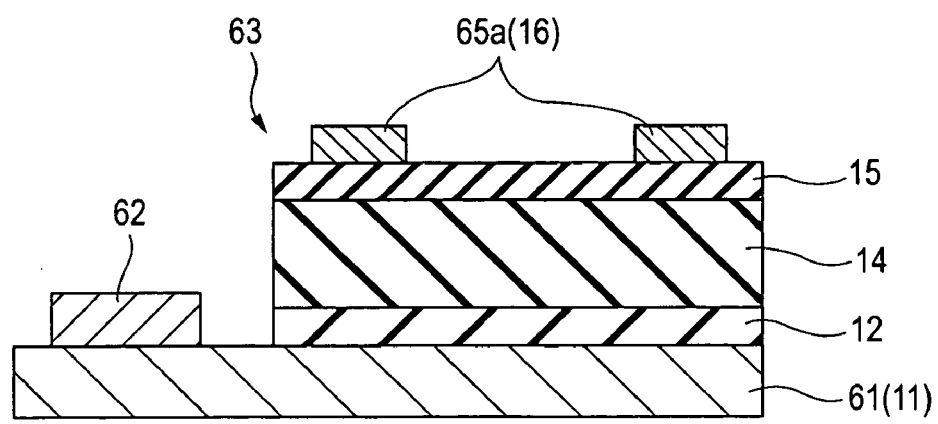
FIG. 22 is a schematic diagram of an example in which the oscillator according to the seventh embodiment of the present is applied to VCSO.

In addition, the VCSO can also be formed by integrating the IC 62 and the oscillator 63 on the same substrate. FIG. 22 schematically illustrates a VCSO where the IC 62 and the oscillator 63 are integrated on the same substrate 61. In addition, in FIG. 22, the oscillator 63 has the same structure as the surface-acoustic-wave element 30 shown in FIG. 17, except that the electric conduction layer 13 is omitted therefrom.

As shown in FIG. 22, VCSO is formed so that the IC 62 and the oscillator 63 share the substrate 61. As the substrate 61, for example, the substrate 11 of the surface-acoustic-wave element 30 shown in FIG. 17 can be used. The IC 62 and the electrode 65a of the oscillator 63 are electrically connected to each other, although not shown. As the electrode 65a, for example, the electrode 16 of the surface-acoustic-wave element 30 shown in FIG. 17 can be used. As a transistor constituting the IC 62, thin film transistors (TFTs) are employable.

Figure 23:
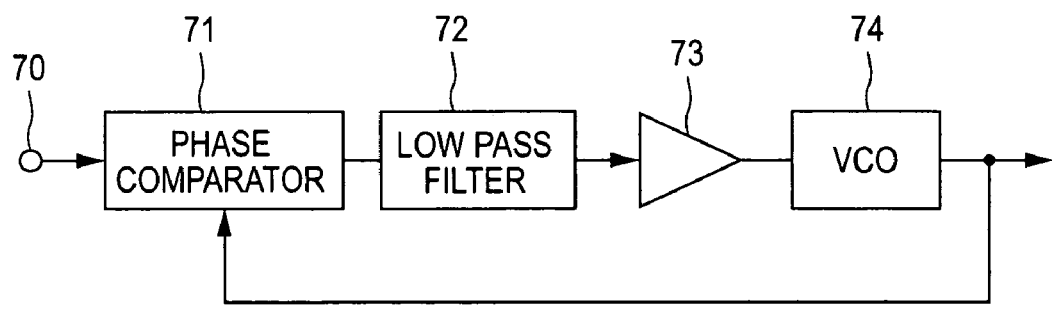
FIG. 23 is a block diagram showing a basic construction of a PLL circuit.

VCSO shown in FIGS. 20 to 22 can be used as a voltage controlled oscillator (VCO) for a PLL circuit shown in FIG. 23. Hereinafter, the PLL circuit will be described in brief.

FIG. 23 is a block diagram showing the basic construction of a PLL circuit. The PLL circuit includes a phase comparator 71, a low pass filter 72, an amplifier 73, and a VCO 74. The phase comparator 71 compares the phase (or frequency) of the signal input from the input terminal 70 with the phase (or frequency) of the signal output from VCO 74, and then generates an error voltage signal where a value corresponding to the difference is set. The low pass filter 72 is designed to pass only low frequency components contained in the error voltage signal output from the phase comparator 71. The amplifier 73 amplifies the signal output from the low-pass filter 72. The VCO 74 is an oscillating circuit where the frequency oscillation according to the input voltage value continuously changes in a certain range.

A PLL circuit with this construction operates such that the difference of the phase (or frequency) input from the input terminal 70 and the phase (or frequency) of the signal output from VCO 74 can decrease, and synchronizes the frequency of the signal output from VCO 74 with the frequency of the signal input from the input terminal 70. Once the frequency of the signal output from VCO 74 is synchronized with the frequency of the signal input from the input terminal 70, except a predetermined phase difference, a signal which coincides with the signal input from the input terminal 70 and which follows change of the input signal is output.

8. Eighth Embodiment

Figure 24:
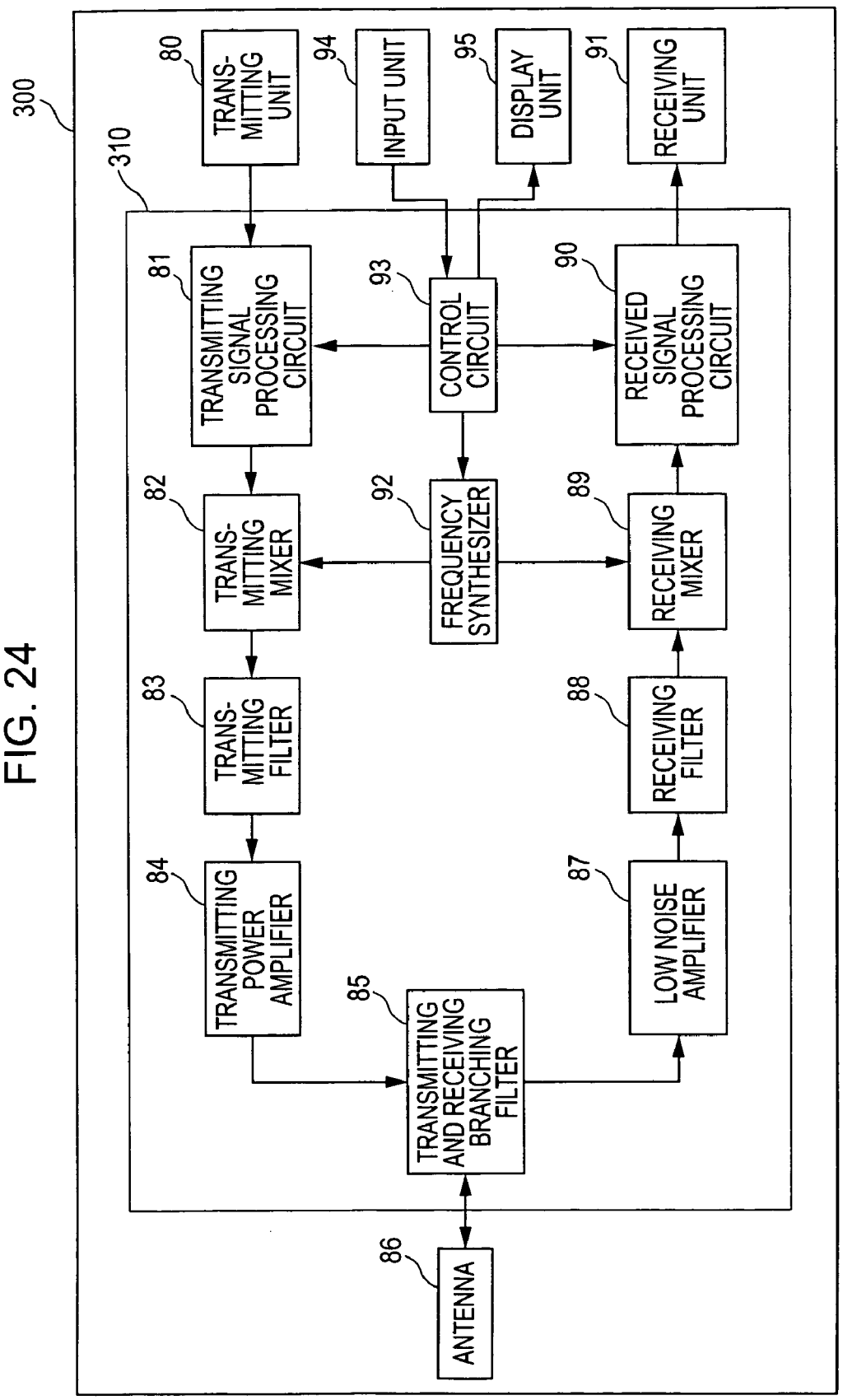
FIG. 24 is a block diagram showing the construction of an electronic circuit according to an eighth embodiment of the present invention.

Next, an example of an electronic circuit and an electronic apparatus according to the eighth embodiment of this invention will be described. FIG. 24 is a block diagram showing the electrical configuration of an electronic apparatus 300 according to an example of this embodiment. As an electronic apparatus 300, a portable telephone can be exemplified.

The electronic apparatus 300 has an electronic circuit 310, a transmitting unit 80, a receiving unit 91, an input unit 94, a display unit 95, and an antenna 86. The electronic circuit 310 has a transmitting signal processing circuit 81, a transmitting mixer 82, a transmitting filter 83, a transmitting power amplifier 84, a transmitting and receiving branching filter 85, a low noise amplifier 87, a receiving filter 88, a receiving mixer 89, a received signal processing circuit 90, a frequency synthesizer 92, and a control circuit 93.

In the electronic circuit 310, the frequency filter shown in FIG. 18 can be used as the transmitting filter 83 and a receiving filter 88. The frequency (frequency to pass) to be filtered is individually set in the transmitting filter 83 and the receiving filter 88, according to the frequency in need among the signals output from the transmitting mixer 82, and the frequency needed by the receiving mixer 89. Further, as the VCO 74 of the PLL circuit (refer to FIG. 23) provided in the frequency synthesizer 92, the oscillator shown in FIG. 19 or VCSO shown in FIGS. 20 to 22 can be used.

The transmitting unit 80 can be implemented as, for example, a microphone which converts a sound wave signal into an electric signal. The transmitting signal processing circuit 81 is a circuit which performs, for example, D/A conversion processing, modulation processing, etc., on the electric signal output from the transmitting unit 80. The transmitting mixer 82 mixes the signal output from the transmitting signal processing circuit 81 using the signal output from the frequency synthesizer 92. The transmitting filter 83 passes only the signal in need with an intermediate frequency for which intermediate frequency (hereinafter, referred to as "IF"), and cuts the signal with a frequency not needed. The signal output from the transmitting filter 83 is converted into an RF signal by a converter circuit (not shown). The transmitting power amplifier 84 amplifies the electric power of the RF signal output from the transmitting filter 83, and outputs it to the transmitting and receiving branching filter 85.

The transmitting and receiving branching filter 85 outputs RF signal output from the transmitting power amplifier 84 to the antenna 86, and transmits it in the form of an electric wave from the antenna 86. Moreover, the transmitting and receiving branching unit 85 branches the signal received by the antenna 86, and outputs it to the low noise amplifier 87. The low noise amplifier 87 amplifies the. signal received from the transmitting and receiving unit 85. The signal output from the low noise amplifier 87 is converted into IF by a converter circuit (not shown).

The receiving filter 88 passes only the signal with a frequency in need for IF converted by a converter circuit (not shown), and cuts the signal with a frequency not needed. The receiving mixer 89 mixes the signals output from the receiving filter 88, using the signal output from the frequency synthesizer 92. The received signal processing circuit 90 processes the signal output from the receiving mixer 89, for example, A/D conversion processing, demodulation processing, etc. The receiving unit 91 can be implemented as, for example, a compact speaker which converted an electric signal into a sound wave.

The frequency synthesizer 92 is a circuit for generating the signal to be supplied to the transmitting mixer 82, and the signal to be supplied to the receiving mixer 89. The frequency synthesizer 92 has a PLL circuit and can generate a new signal by dividing the signal output from the PLL circuit. The control circuit 93 controls the transmitting signal processing circuit 81, the received signal processing circuit 90, the frequency synthesizer 92, the input unit 94, and the display unit 95. The display unit 95 displays the state of a device for who uses the device, for example, a portable telephone. The input unit 94 is for inputting, for example, indications from the user of a portable telephone.

In addition, although a portable telephone is exemplified as an electronic apparatus, and an electronic circuit provided in a portable telephone is exemplified as an electronic circuit, this invention is not limited thereto, and can be applied to various mobile communication apparatuses and electronic circuits provided therein.

Moreover, it can be applied not only to a mobile communications apparatus, but also to the communication apparatus used in a state of deferment of the tuner which receives BS and CS broadcastings and electronic circuits provided therein. Furthermore, the communication carrier is not only limited to the communication apparatus using electric waves which propagate in the air, but also can be applied to an electronic apparatus such as HUB using a high frequency signal which propagates through a coaxial cable or an optical cable, or an optical signal which propagates through an optical cable, and to an electronic circuit provided therein.

9. Ninth Embodiment

Next, an example of a thin-film piezoelectric resonator according to a ninth embodiment will be described referring to a drawing.

9-1. First Thin-film Piezoelectric Resonator

Figure 25:
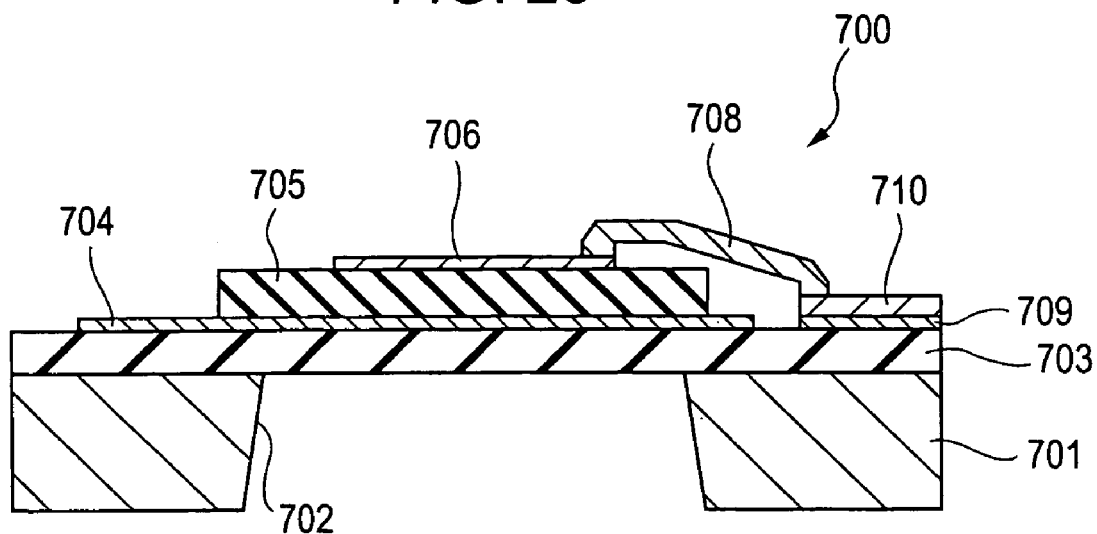
FIG. 25 is a sectional side view illustrating a thin-film piezoelectric resonator according to a ninth embodiment of the present invention.

FIG. 25 schematically illustrates a first thin-film piezoelectric resonator 700 as an example of this embodiment. The first thin-film piezoelectric resonator 700 is a diaphragm-type thin-film piezoelectric resonator.

The first thin-film piezoelectric resonator 700 includes a substrate 701, an elastic film 703, a lower electrode 704, a piezoelectric film 705, and an upper electrode 706. The substrate 701, the elastic film 703, the lower electrode 704, the piezoelectric film 705 and the upper electrode 706 of the thin-film piezoelectric resonator 700 are respectively equivalent to the substrate 2, the buffer layer 3, the lower electrode 4, the piezoelectric film 5 and the upper electrode 6 of the piezoelectric element 1 shown in FIG. 1. That is, the first thin-film piezoelectric resonator 700 has the piezoelectric element 1 shown in FIG. 1.

A via hole 702 which penetrates a substrate 701 is provided in the substrate 701. Wiring 708 is formed on the upper electrode 706. The wiring 708 is electrically connected to an electrode 709 formed on the elastic film 703 with the pad 710 interposed therebetween.

9-2. Operation and Advantages

According to the first thin-film piezoelectric resonator 700 of this embodiment, it has a high electromechanical coupling coefficient since the piezoelectric film 705 has good piezoelectric properties. Therefore, it is possible to use the thin-film piezoelectric resonator 700 in a high frequency domain. Further, the thin-film piezoelectric resonator 700 can be miniaturized (made thin) and can be operated well.

9-3. Second Thin-film Piezoelectric Resonator

Figure 26:
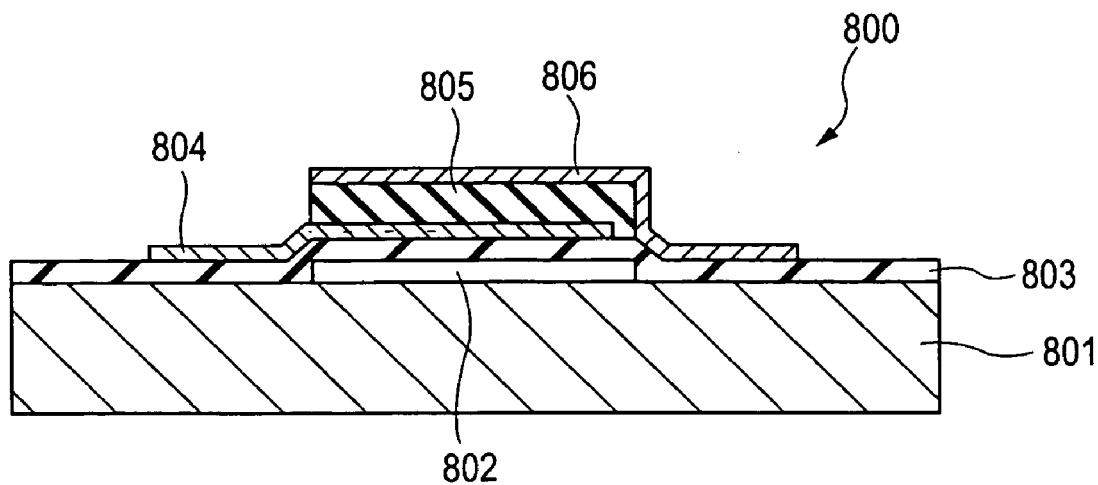
FIG. 26 is a sectional side view illustrating the thin-film piezoelectric resonator according to the ninth embodiment of the present invention.

FIG. 26 schematically illustrates a second thin-film piezoelectric resonator 800 as an example of this embodiment. The second thin-film piezoelectric resonator 800 is different from the first thin-film piezoelectric resonator 700 shown in FIG. 25 in that via hole is not formed, but an air gap 802 is formed between a substrate 801 and an elastic film 803 instead.

The second thin-film piezoelectric resonator 800 includes a substrate 801, an elastic film 803, a lower electrode 804, a piezoelectric film 805, and an upper electrode 806. The substrate 801, the elastic film 803, the lower electrode 804, the piezoelectric film 805 and the upper electrode 806 of the thin-film piezoelectric resonator 800 are respectively equivalent to the substrate 2, the buffer layer 3, the lower electrode 4, the piezoelectric film 5 and the upper electrode 6 of the piezoelectric element 1 shown in FIG. 1. That is, the second thin-film piezoelectric resonator 800 has the piezoelectric element 1 shown in FIG. 1. The air gap 802 is a space formed between the substrate 801 and the elastic film 803.

9-4. Operations and Advantages

According to the second thin-film piezoelectric resonator 800 according to this embodiment, it has a high electromechanical coupling coefficient since the piezoelectric film 805 has good piezoelectric properties. Therefore, it is possible to use the thin-film piezoelectric resonator 800 in a high frequency domain. Further, the thin-film piezoelectric resonator 800 can be miniaturized (made thin) and can be operated well.

9-5. Applications

The piezoelectric thin film resonator according to this embodiment (for example, the first thin-film piezoelectric resonator 700 and the second thin-film piezoelectric resonator 800) can function as a resonator, a frequency filter or an oscillator. Also, for example, the piezoelectric thin film resonator according to this embodiment which functions as a frequency filter can be used as a transmitting filter 83 and a receiving filter 88 of the electronic circuit 310 shown in FIG. 24. Further, the piezoelectric thin film resonator according to this embodiment which functions as an oscillator can be used as an oscillator of a frequency synthesizer 92.

As described above, the embodiments according to the present invention have been described hithertoin detail. It can be easily understood by an ordinary skilled person in this art, however, that a large number of modifications can be made without substantially deviating from the subject matter and advantages disclosed by this invention. Therefore, all such modifications shall be construed to be included in the scope of the present invention. For example, the piezoelectric element according to the present invention is not only applied to devices mentioned above, but also is applicable to various devices.

What is claimed is:

1. A piezoelectric film represented by the following general formula:

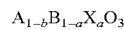

wherein A contains Pb;
B is at least one of Zr and Ti;
X is at least one of V, Nb, Ta, Cr, Mo and W;
a satisfies $0.05 \leqq a \leqq 0.3$;
b satisfies $0.025 \leqq b \leqq 0.15$; and
the piezoelectric film has a rhombohedral structure and a (100) orientation in a pseudo-cubic crystal system.

2. The piezoelectric film according to claim 1, wherein the Pb is partially substituted with at least one element whose valence is higher than that of Pb.

3. The piezoelectric film according to claim 2, wherein the at least one element whose valence is higher than that of Pb is selected from the group consisting of lanthanoids.

4. The piezoelectric film according to claim 1, wherein X is at least one of V, Nb and Ta, and the deficient amount b of A is almost half of the additive amount a of X.

5. The piezoelectric film according to claim 1, wherein X is at least one of Cr, Mo and W, and the deficient amount b of A is almost the same as the additive amount a of X.

6. The piezoelectric film according to claim 1,
wherein X includes X1 and X2;
the composition ratio of X1 and X2 is represented by (a−e):e;
X1 is at least one of V, Nb and Ta;
X2 is at least one of Cr, Mo and W; and
the deficient amount b of A is almost the same as the total amount of (a−e)/2, which is a half of the additive amount of X1 and the additive amount e of X2.

7. The piezoelectric film according to claim 1, wherein X is present at B sites of a perovskite structure.

8. The piezoelectric film according to claim 1, wherein B includes Zr and Ti;
the composition ratio of Zr and Ti is represented by (1−p):p; and
p satisfies $0.2 \leqq p \leqq 0.6$.

9. A piezoelectric element comprising the piezoelectric film according to claim 1.

10. A piezoelectric element according to claim 9, the element further comprising
a lower electrode formed on a substrate, the piezoelectric film being formed on the lower electrode; and
an upper electrode formed on the piezoelectric film, wherein at least one of the lower electrode and the upper electrode is made of a material whose main component is Pt.

11. The piezoelectric element according to claim 9, the element further comprising:
   a buffer layer formed on the substrate by an ion-beam assisted method;
   a lower electrode of a perovskite structure formed on the buffer layer, the piezoelectric film being formed on the lower electrode; and
   an upper electrode formed on the piezoelectric film.

12. A piezoelectric element according to claim 11, wherein the lower electrode has the preferred (100) orientation in a pseudo-cubic crystal system by epitaxial growth.

13. A piezoelectric actuator comprising the piezoelectric element according to claim 9.

14. A piezoelectric pump comprising the piezoelectric element according to claim 9.

15. An ink-jet type recording head comprising the piezoelectric element according to claim 9.

16. An ink-jet printer comprising the ink-jet type recording head according to claim 15.

17. A surface-acoustic-wave element comprising the piezoelectric element according to claim 9.

18. A thin-film piezoelectric resonator comprising the piezoelectric element according to claim 9.

* * * * *